US012652028B2

(12) United States Patent
Tailliet et al.

(10) Patent No.: US 12,652,028 B2
(45) Date of Patent: Jun. 9, 2026

(54) COMPACT, STABLE PULSE FILTER AND DELAY CIRCUIT

(71) Applicant: STMicroelectronics International N.V., Geneva (CH)

(72) Inventors: Francois Tailliet, Fuveau (FR); Sylvain Passemard, Cadenet (FR)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 0 days.

(21) Appl. No.: 18/924,074

(22) Filed: Oct. 23, 2024

(65) Prior Publication Data

US 2026/0113019 A1    Apr. 23, 2026

(51) Int. Cl.
 H03K 3/037 (2006.01)
 H03K 19/21 (2006.01)
(52) U.S. Cl.
 CPC ............. H03K 3/037 (2013.01); H03K 19/21 (2013.01)
(58) Field of Classification Search
 CPC .............................. H03K 3/037; H03K 19/21
 USPC .......................................................... 327/225
 See application file for complete search history.

(56) References Cited

U.S. PATENT DOCUMENTS

| | | | | |
|---|---|---|---|---|
| 10,033,391 B2 * | 7/2018 | Penzes | ................. | H03K 3/0315 |
| 10,541,692 B1 * | 1/2020 | Zamprogno | .......... | H03L 7/0812 |
| 10,742,220 B1 * | 8/2020 | Rao | ........................ | H03K 21/38 |
| 2008/0007305 A1 | 1/2008 | Lin et al. | | |
| 2010/0156524 A1 | 6/2010 | Saxena | | |
| 2016/0308520 A1 * | 10/2016 | Cho | ....................... | H03K 5/131 |
| 2019/0212770 A1 | 7/2019 | Hashempour et al. | | |
| 2023/0092886 A1 | 3/2023 | Shen | | |

* cited by examiner

*Primary Examiner* — Tomi Skibinski
(74) *Attorney, Agent, or Firm* — Alston & Bird LLP

(57)    ABSTRACT

An example circuit, method, and electronic device configured to filter pulses below a minimum threshold pulse width and provide delays that exhibit low variance to changes in temperature, voltage, and technology processes, are provided. The example circuit includes a first flip/flop, a second flip/flop, and a charge detector. The first flip/flop generates a first out signal and a first inverse signal based on an input signal and a first clocking signal. The second flip/flop generates an output signal and a second out signal based on the first out signal, the first inverse signal, and a second clocking signal, wherein the second clocking signal is an inverse of the first clocking signal. The charge detector circuit includes a charging capacitor to generate a charge signal based on a change in the input signal, such that pulses are filtered based on a capacitance value of the charging capacitor and a reference voltage.

20 Claims, 19 Drawing Sheets

1300

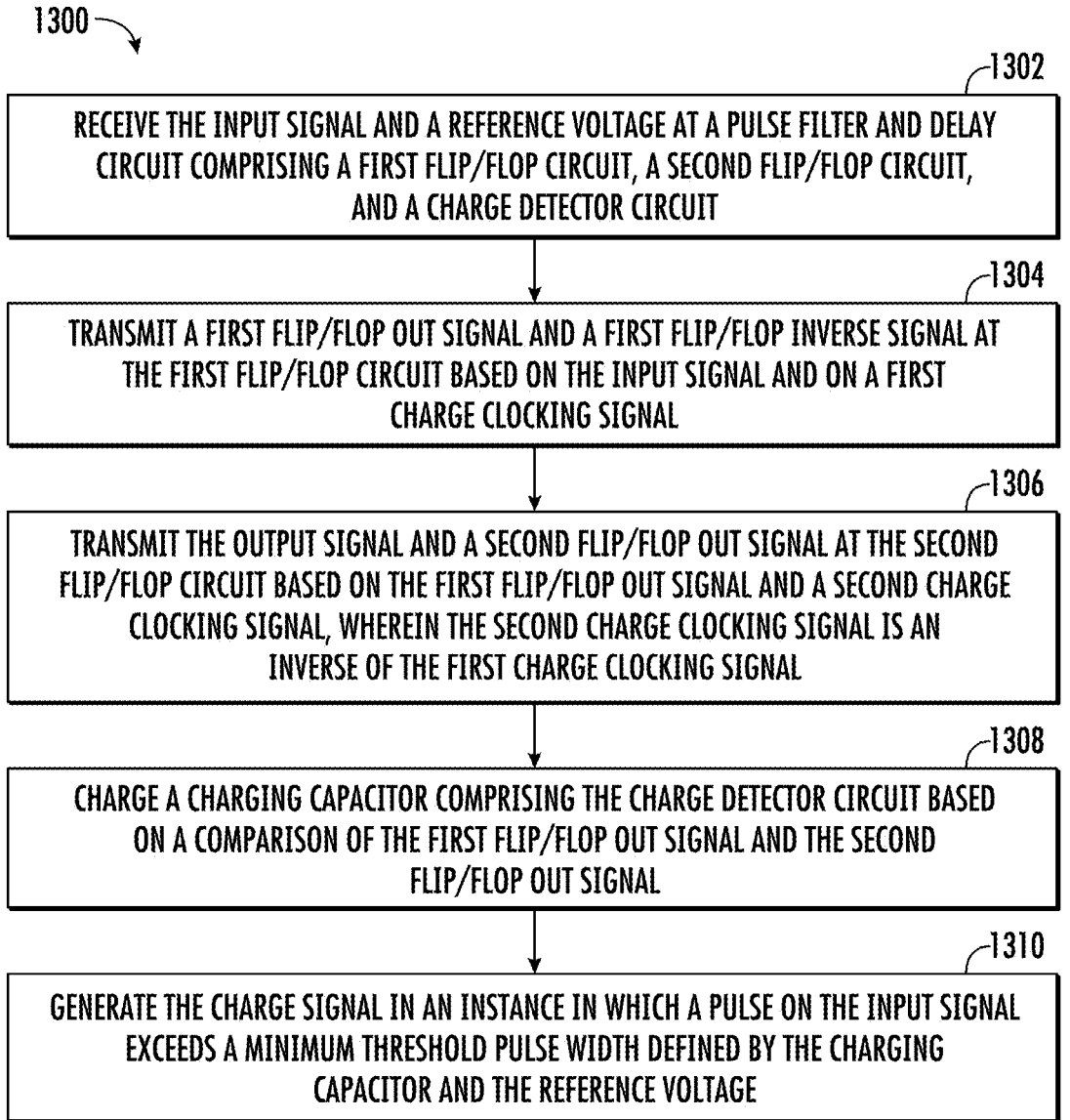

1302

RECEIVE THE INPUT SIGNAL AND A REFERENCE VOLTAGE AT A PULSE FILTER AND DELAY CIRCUIT COMPRISING A FIRST FLIP/FLOP CIRCUIT, A SECOND FLIP/FLOP CIRCUIT, AND A CHARGE DETECTOR CIRCUIT

1304

TRANSMIT A FIRST FLIP/FLOP OUT SIGNAL AND A FIRST FLIP/FLOP INVERSE SIGNAL AT THE FIRST FLIP/FLOP CIRCUIT BASED ON THE INPUT SIGNAL AND ON A FIRST CHARGE CLOCKING SIGNAL

1306

TRANSMIT THE OUTPUT SIGNAL AND A SECOND FLIP/FLOP OUT SIGNAL AT THE SECOND FLIP/FLOP CIRCUIT BASED ON THE FIRST FLIP/FLOP OUT SIGNAL AND A SECOND CHARGE CLOCKING SIGNAL, WHEREIN THE SECOND CHARGE CLOCKING SIGNAL IS AN INVERSE OF THE FIRST CHARGE CLOCKING SIGNAL

1308

CHARGE A CHARGING CAPACITOR COMPRISING THE CHARGE DETECTOR CIRCUIT BASED ON A COMPARISON OF THE FIRST FLIP/FLOP OUT SIGNAL AND THE SECOND FLIP/FLOP OUT SIGNAL

1310

GENERATE THE CHARGE SIGNAL IN AN INSTANCE IN WHICH A PULSE ON THE INPUT SIGNAL EXCEEDS A MINIMUM THRESHOLD PULSE WIDTH DEFINED BY THE CHARGING CAPACITOR AND THE REFERENCE VOLTAGE

FIG. 13

COMPACT, STABLE PULSE FILTER AND DELAY CIRCUIT

TECHNOLOGICAL FIELD

Embodiments of the present disclosure relate generally to pulse filter and delay circuits, and more particularly, to pulse filter and delay circuits with improved stability and reduced area footprints.

BACKGROUND

Inter-integrated circuit (I2C) protocol enables simple communication between multiple devices using two signals: a clock signal and a data signal. I2C may be utilized by microcontrollers, memories, computer monitors, sensors, and many other interconnected devices. The I2C protocol is widely used because of its simplicity and power efficiency. The I2C communication protocol includes various requirements related to pulse filtering and precise signal timing.

Applicant has identified many technical challenges and difficulties associated with filtering and precisely delaying an input signal. Through applied effort, ingenuity, and innovation, Applicant has solved problems related to the position of these and other wearable devices by developing solutions embodied in the present disclosure, which are described in detail below.

BRIEF SUMMARY

Various embodiments are directed to an example circuit, method, and electronic device configured to filter pulses below a minimum threshold pulse width and provide delays that exhibit low variance to changes in temperature, voltage, and technology processes.

An example circuit is provided. The example circuit comprising a first flip/flop circuit, a second flip/flop circuit, and a charge detector. The first flip/flop circuit configured to generate a first flip/flop out signal and a first flip/flop inverse signal based on an input signal and a first charge clocking signal. The second flip/flop circuit configured to generate an output signal and a second flip/flop out signal based on the first flip/flop out signal, the first flip/flop inverse signal, and a second charge clocking signal, wherein the second charge clocking signal comprises an inverse of the first charge clocking signal. The charge detector circuit comprising at least a charging capacitor and configured to generate a charge signal based on a change in the input signal, wherein the first charge clocking signal is generated based on the charge signal, and wherein the charge detector circuit is configured to filter pulses based on a capacitance value of the charging capacitor and a reference voltage.

In some embodiments, the output signal is delayed relative to the input signal by an output delay based on the charging capacitor and the reference voltage.

In some embodiments, the circuit further comprises clocking circuitry comprising a first input configured to receive the charge signal; a first output configured to generate the first charge clocking signal based on the charge signal and a system reset signal; and a second output configured to generate the second charge clocking signal based on the first charge clocking signal and the system reset signal.

In some embodiments, the first charge clocking signal is generated by performing a NAND logic operation on the charge signal and the system reset signal, and the second charge clocking signal is generated by performing a NAND logic operation on the first charge clocking signal and the system reset signal.

In some embodiments, the first flip/flop circuit comprises a first RS flip-flop. The RS flip-flop circuit comprising: a first input configured to receive the input signal; a second input configured to receive an inverse input signal; a third input configured to receive the first charge clocking signal; a first output configured to generate the first flip/flop inverse signal; and a second output configured to generate the first flip/flop out signal.

In some embodiments, the second flip/flop circuit comprises a second RS flip-flop. The second RS flip-flop comprising: a first input configured to receive the first flip/flop inverse signal; a second input configured to receive the first flip/flop output signal; a third input configured to receive the second charge clocking signal; a first output configured to generate a second flip/flop inverse signal; and a second output configured to generate a second flip/flop out signal.

In some embodiments, the output signal comprises the second flip/flop inverse signal.

In some embodiments, the charge detector circuit comprises: a first input configured to receive the first flip/flop out signal; a second input configured to receive the second flip/flop out signal; a third input configured to receive the reference voltage; and a first output configured to generate the charge signal.

In some embodiments, the charge detector circuit is configured to charge the charging capacitor based on an XOR operation of the first flip/flop out signal and the second flip/flop out signal.

In some embodiments, during an initialization state, in which the system reset signal is asserted, the first flip/flop out signal and the second flip/flop out signal are forced to a logic equivalent.

An example method for generating a pulse filtered and delayed output signal based on an input signal is further provided. The example method comprises: receiving the input signal and a reference voltage at a pulse filter and delay circuit comprising a first flip/flop circuit, a second flip/flop circuit, and a charge detector circuit; transmitting a first flip/flop out signal and a first flip/flop inverse signal at the first flip/flop circuit based on the input signal and on a first charge clocking signal; transmitting the output signal and a second flip/flop out signal at the second flip/flop circuit based on the first flip/flop out signal and a second charge clocking signal, wherein the second charge clocking signal is an inverse of the first charge clocking signal; charging a charging capacitor comprising the charge detector circuit based on a comparison of the first flip/flop out signal and the second flip/flop out signal; and generating the charge signal in an instance in which a pulse on the input signal exceeds a minimum threshold pulse width defined by the charging capacitor and the reference voltage.

An example electronic device configured to transmit signals on an inter-integrated communication (I2C) bus is further provided. The example electronic device comprising a serial data terminal, a serial clock terminal, and a pulse filter and delay circuit. The serial data terminal configured to receive a serial data signal on a serial data line of an I2C bus. The serial clock terminal configured to receive a serial clock signal on a serial clock line of an I2C bus. The pulse filter and delay circuit, comprising: a first flip/flop circuit, a second flip/flop circuit, and a charge detector circuit. The first flip/flop circuit configured to transmit a first flip/flop out signal and a first flip/flop inverse signal based on an input signal and a first charge clocking signal. The second flip/flop circuit configured to transmit an output signal and a second flip/flop out signal based on the first flip/flop out signal, the first flip/flop inverse signal, and a second charge clocking signal, wherein the second charge clocking signal comprises an inverse of the first charge clocking signal. The charge detector circuit comprising at least a charging capacitor and configured to generate a charge signal based on a change in the input signal, wherein the first charge clocking signal is generated based on the charge signal; wherein the input signal is coupled to the serial data terminal, and wherein the pulse filter and delay circuit is configured to filter pulses based on a capacitance value of the charging capacitor and a reference voltage.

In some embodiments, the output signal is delayed relative to the input signal by an output delay based on the charging capacitor and the reference voltage.

In some embodiments, the electronic device further comprises clocking circuitry comprising: a first input configured to receive the charge signal; a first output configured to generate the first charge clocking signal based on the charge signal and a system reset signal; and a second output configured to generate the second charge clocking signal based on the first charge clocking signal and the system reset signal.

In some embodiments, the first charge clocking signal is generated by performing a NAND logic operation on the charge signal and the system reset signal, and wherein the second charge clocking signal is generated by performing a NAND logic operation on the first charge clocking signal and the system reset signal.

In some embodiments, the first flip/flop circuit comprises a first RS flip-flop. The first RS flip-flop comprising: a first input configured to receive the input signal; a second input configured to receive an inverse input signal; a third input configured to receive the first charge clocking signal; a first output configured to generate the first flip/flop inverse signal; and a second output configured to generate the first flip/flop out signal.

In some embodiments, the second flip/flop circuit comprises a second RS flip-flop. The second RS flip-flop comprising: a first input configured to receive the first flip/flop inverse signal; a second input configured to receive the first flip/flop output signal; a third input configured to receive the second charge clocking signal; a first output configured to generate a second flip/flop inverse signal; and a second output configured to generate a second flip/flop out signal.

In some embodiments, the output signal comprises a logic NOT of the second flip/flop inverse signal.

In some embodiments, the charge detector circuit comprises: a first input configured to receive the first flip/flop out signal; a second input configured to receive the second flip/flop out signal; a third input configured to receive the reference voltage; and a first output configured to generate the charge signal.

In some embodiments, the charge detector circuit is configured to charge the charging capacitor based on an XOR operation of the first flip/flop out signal and the second flip/flop out signal.

BRIEF DESCRIPTION OF THE DRAWINGS

Reference will now be made to the accompanying drawings. The components illustrated in the figures may or may not be present in certain embodiments described herein. Some embodiments may include fewer (or more) components than those shown in the figures in accordance with an example embodiment of the present disclosure.

FIG. 13 depicts a flow chart of an example process for generating a pulse filtered and delayed output signal based on an input signal in accordance with an example embodiment of the present disclosure.

DETAILED DESCRIPTION

Figure 1:
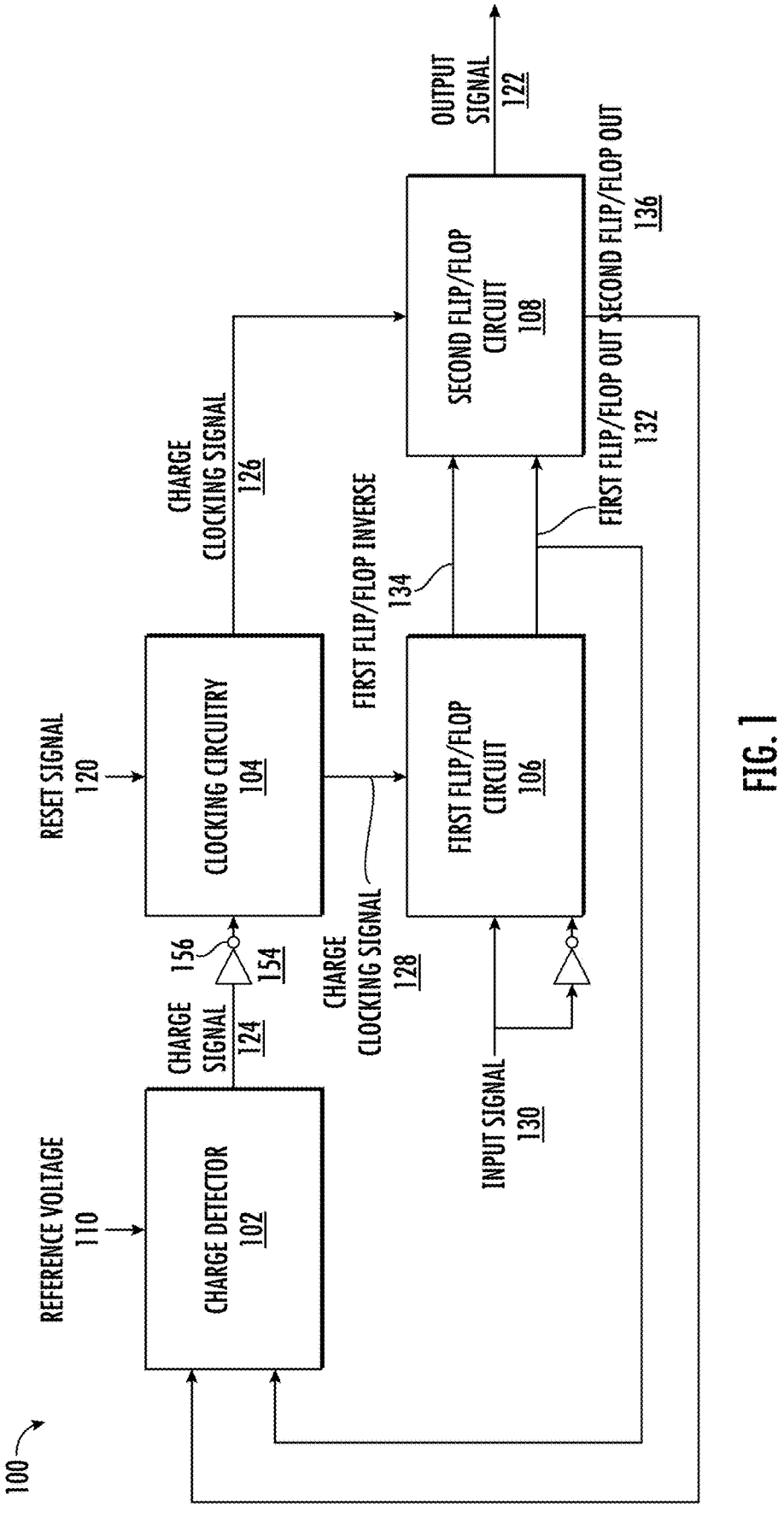
FIG. 1 depicts a block diagram of an example pulse filter and delay circuit in accordance with an example embodiment of the present disclosure.

Example embodiments will be described more fully hereinafter with reference to the accompanying drawings, in which some, but not all embodiments of the inventions of the disclosure are shown. Indeed, embodiments of the disclosure may be embodied in many different forms and should not be construed as limited to the embodiments set forth herein; rather, these embodiments are provided so that this disclosure will satisfy applicable legal requirements. Like numbers refer to like elements throughout.

Various example embodiments address technical problems associated with generating a filtered and delayed output signal based on an input signal that exhibits low variation to changes in process technology, voltage, and temperature within a variance of ten percent. As understood by those of skill in the field to which the present disclosure pertains, there are many example devices that may benefit for a circuit configured to perform pulse filtering and precision delays that occupy a small area and exhibit low variation to changes in process technology, voltage, and temperature.

For example, an inter-integrated circuit (I2C) protocol enables simple communication between multiple devices using two signals: a clock signal and a data signal. I2C may be utilized by microcontrollers, memories, computer monitors, sensors, and many other interconnected devices. The I2C protocol is widely used because of its simplicity and power efficiency. The I2C protocol is a serial protocol that utilizes the clock signal to synchronize communication between devices. The I2C protocol utilizes the data signal to transmit data to or from target devices. I2C is a half-duplex communication system in which only a single controller or target device is sending data on the bus.

In general, an I2C controller utilizes transitions of the data signal in an instance in which the clock signal is high to indicate the start and stop of a data transition. Timing the transition of the data signal with the period of time in which the clock signal is high may require precise timing. The transition window may be further limited based on setup and hold times associated with the clock signal and data signal.

In addition, the I2C protocol recommends low-pass pulse filtering to filter out generated pulses having a pulse width smaller than a minimum threshold pulse width on the data signal and/or clock signal. For example, glitches and/or irregularities on the data signal and/or clock signal should not register as valid I2C signal transitions. Thus, filtering circuitry may be configured to trigger a signal transition only when the signal transition exceeds a specific transition hold time.

As such, there is a need in support of I2C communication for circuitry to perform pulse filtering, and further perform precise and repeatable delays even with variations in voltage, temperature, and process technology. In addition, often devices configured to communicate according to the I2C protocol have strict size requirements. Thus, a reduction in the size of the circuitry may be necessary.

In addition to various applications within an I2C communication device, such circuitry may be utilized in any application in which a precise delay and/or reliable pulse filter are needed. For example, a ring oscillator may utilize a plurality of delay circuit elements to generate a consistent oscillating signal. By utilizing one or more pulse filter and delay circuits according to one or more of the proposed embodiments, a precise oscillating signal may be generated that exhibits low variation to changes in voltage, temperature, and process technology.

Some example circuits to perform pulse filtering and transition delays have been developed, for example circuits utilizing Schmitt triggers. However, such circuits have exhibited delay time variation, particularly with variations of input voltage high or low time durations. Additional examples have sought to overcome the limitations of Schmitt triggers in performing pulse filtering and delays. However, these examples include separate components for detecting rising transitions and falling transitions. Including separate components for detecting rising transitions and falling transitions requires additional hardware components for each type of signal transition. Additional electrical components occupy additional space. The additional space occupied by each delay circuit presents difficulties in reducing the size of the electrical components. In addition, separate hardware for each type of signal transition may lead to issues with mismatched circuitry, particularly due to manufacture variability and/or aging. Mismatched circuitry may not only lead to variation due to changes in temperature, and voltage, but also variations between the rising edge and falling edge delay.

The various example embodiments described herein utilize various techniques to perform pulse filtering and precision delay on an input signal. In addition, the pulse filter and delay circuit described herein is configured to perform pulse filtering and precision delays for both rising edge and falling edge clock events in a reduced size circuit. For example, in some embodiments, the pulse filter and delay circuit may include a single charge detector circuit configured to detect and delay both rising edge transitions and falling edge detections. The single charge detector circuit is made possible by a pair of buffering circuitries connected in series and driven, in part, by the input signal. During operation, the buffering circuitries are configured such that a difference in outputs from a first flip/flop circuitry and a second flip/flop circuitry due to any change of the input signal (e.g., rising edge or falling edge) causes a charging capacitor in the charge detector circuitry to start charging. However, the change in input will only be output in an instance in which the duration of the change is long enough to trigger an output from the charge detector circuit. In some embodiments, the minimum duration of the change is defined by a reference current and a threshold voltage of a switching device comprising the charge detector circuit.

By utilizing charge detector circuitry and accompanying flip/flop circuitry to detect both rising and falling edge transitions, the area occupied by a pulse filter and delay circuit may be significantly reduced. In addition, by eliminating additional circuitry for detecting each type of signal transition, delay error due to mismatched electrical components may be eliminated. Further, the pulse filtering and delay executed by circuitry in accordance with the present disclosure may exhibit low variation with variations in voltage, temperature, and technology process.

Referring now to FIG. 1, an example block diagram of an example pulse filter and delay circuit 100 is provided. As depicted in FIG. 1, the example pulse filter and delay circuit 100 includes a charge detector circuitry 102 configured to receive a reference voltage 110, a first flip/flop out signal 132 from a first flip/flop circuit 106, and a second flip/flop out signal 136 from a second flip/flop circuit 108, and generate a charge signal 124. The first flip/flop circuit 106 is configured to receive the input signal 130. In addition, the first flip/flop circuit 106 is configured to receive a first charge clocking signal 128 from clocking circuitry 104. The first flip/flop circuit 106 is configured to output the first flip/flop out signal 132 and a first flip/flop inverse signal 134. As further depicted in FIG. 1, a second flip/flop circuit 108 is configured to receive the first flip/flop inverse signal 134 and the first flip/flop out signal 132 from the first flip/flop circuit 106. The second flip/flop circuit 108 is further configured to receive a second charge clocking signal 126 from the clocking circuitry 104. The second flip/flop circuit is configured to generate the second flip/flop out signal 136 and an output signal 122 representing a pulse filtered and delayed input signal 130. As further depicted in FIG. 1, the clocking circuitry 104 is configured to receive the inverted charge signal 156 from the inverter 154 based on the charge signal 124 of the charge detector circuitry 102, and a reset signal 120 (e.g., system reset signal, power on reset signal), and generate a first charge clocking signal 128 and a second charge clocking signal 126.

As depicted in FIG. 1, the example pulse filter and delay circuit 100 is configured to receive an input signal 130. An input signal 130 comprises any digital signal configured to represent discrete values based on the electrical properties of the signal.

In some embodiments, the input signal 130 may comprise a binary signal or logic signal in which two values may be represented. A binary signal may comprise one of two states. An example first state of a binary signal is a reference value. A reference value may be referred to as ground, zero, logic zero, logic low, digital low, low, low level, or other similar term. The reference value is generally at or near 0 volts. A binary signal may also be set to a supply voltage value. The supply voltage value may be referred to as supply voltage, one, logic one, logic high, digital high, high, high level, or other similar term. The supply voltage value is generally at or near the supply voltage of the circuit (e.g., 1.0 volts, 1.8 volts, 2.5 volts, 3.3 volts, 5.0 volts, etc.).

The input signal 130 may also experience transitions between a logic high state and a logic low state. A rising edge or rising edge transition may refer to an instance in which an input signal 130 moves from a low state to a high state. A falling edge or falling edge transition, may refer to an instance in which an input signal 130 moves from a high state to a low state.

As described herein, the input signal 130 may represent any data signal, clock signal, control signal, or other digital signal in an electronic device. In some embodiments, the input signal 130 may comprise the serial data signal (SDA) or serial clock signal (SCL) on an I2C communication bus.

During a transmission of data on an I2C communication bus, the signal on the SDA line must be stable during the logic high period of the clock signal. The logic high or logic low state of the serial data signal (SDA) may only change when the serial clock signal (SCL) is logic low. In addition, all the transactions begin with a start condition "START" and finish with an end condition "STOP." A START condition is defined by a falling edge (e.g., a logic high to logic low transition) on the SDA while the SCL is a logic high. A STOP condition is defined by a rising edge (e.g., a logic low to logic high transition) on the SDA while the SCL is logic high. In addition, the I2C communication protocol recommends compliance with a setup time and a hold time on the transitions of the SDA relative to the SCL transitions. Thus, the duration of time during which SDA and SCL may make a valid transition is limited. A precise delay may be required to ensure compliance with the I2C communication protocol.

These valid transition times become even smaller as the frequency of the signal increases.

The I2C protocol further recommends a low-pass filter on the SDA and SCL to eliminate spurious pulses. For example, pulses with a width of less than 50 nanoseconds.

As described herein, the output signal 122 comprises a delayed version of the input signal 130 having pulses under a minimum threshold pulse width filtered out. Thus, a generated I2C signal may be input to the pulse filter and delay circuit 100 and the delay configured, such that the output signal 122 complies with the timing and pulse filtering requirements of I2C communication.

As further depicted in FIG. 1, the pulse filter and delay circuit 100 includes charge detector circuitry 102. Charge detector circuitry 102 comprises any circuitry, comprising at least a charging device (e.g., charging capacitor), configured to begin charging in accordance with a reference voltage 110 in an instance in which a first input signal (e.g., first flip/flop out signal 132) and a second input signal (e.g., second flip/flop out signal 136) comprise different logic states (e.g., logic one and logic zero or vice versa). In addition, the charge detector circuitry 102 is further configured to update the charge signal 124 in an instance in which the charge on the charging device exceeds a charge threshold on a switching device within the charge detector circuitry 102. Updating the charge signal 124 may comprise transitioning from a logic high to a logic low, or vice versa, depending on the logic components of the charge detector circuitry 102.

As described herein, a difference in the first input signal and the second input signal of the charge detector circuitry 102 triggers the charging of the charging capacitor, no matter which signal is high or which signal is low. Thus, the charge detector circuitry 102 may be configured to update the charge signal 124 on both a rising edge change in logic values of the input signal 130 and a falling edge change in logic values of the input signal 130.

Further, the charge detector circuitry 102 is configured to filter pulse widths below a minimum threshold pulse width. The charge detector circuitry 102 may filter pulse widths below a minimum threshold pulse width by comprising a switching device configured to switch in an instance in which a voltage at the switching device exceeds a charge threshold. Thus, the minimum threshold pulse width may be dependent on the reference voltage 110 used to charge the charging device, and the charge threshold of the switching device.

In addition, the delay of the output signal 122 (e.g., output delay) is based on the time required to charge the charging device above the charge threshold. Since the charge signal 124 is not updated until the charge on the charging device exceeds the charge threshold of the switching device, the charge signal may not update until the time required to charge the charging device above the charge threshold has elapsed.

Figure 4:
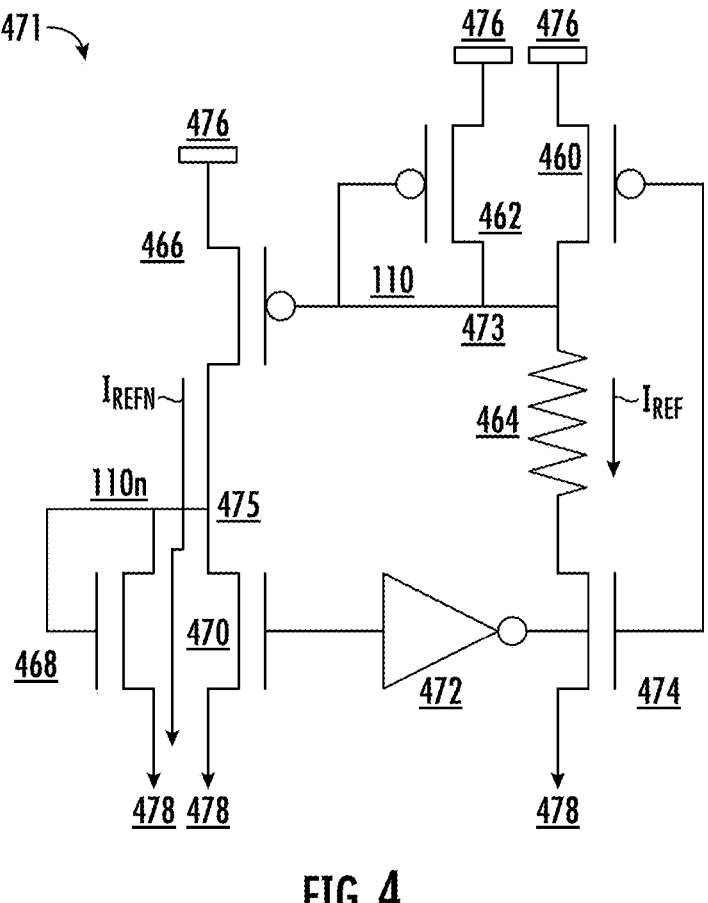
FIG. 4 depicts an example circuit schematic of an example reference current generator in accordance with an example embodiment of the present disclosure.

An example embodiment of the charge detector circuitry 102 is further described in relation to FIG. 4. An example embodiment of a reference voltage source configured to generate a reference current is further described in relation to FIG. 4.

As further depicted in FIG. 1, the inverted charge signal 156 is configured to control the enable state of the first flip/flop circuit 106 and the second flip/flop circuit 108 through the clocking circuitry 104. The clocking circuitry 104 comprises any circuitry including logic components configured to receive a reset signal 120 and the inverted charge signal 156 and output a first charge clocking signal 128 configured to configure the first flip/flop circuit 106 in a transparent mode or a store mode, and a second charge clocking signal 126 configured to configure the second flip/flop circuit 108 in a transparent mode or a store mode.

The reset signal 120 may be any signal configured to initialize and/or reinitialize the state of the pulse filter and delay circuit 100. The reset signal 120 may include a system reset signal, a power-on-reset signal, or a derivation of a reset signal (e.g., the logical NOT of a reset signal). In an instance in which the reset signal 120 is enabled, the clocking circuitry asserts both the first charge clocking signal 128 and the second charge clocking signal 126, subsequently putting both the first flip/flop circuit 106 and the second flip/flop circuit 108 in a transparent mode. With both the first flip/flop circuit 106 and the second flip/flop circuit 108 in a transparent mode, the first flip/flop out signal 132 and the second flip/flop out signal 136 are equivalent, meaning the charging device of the charge detector circuitry 102 is discharged and the charge signal 124 is one.

During operation, in which the reset signal 120 is not asserted, the clocking circuitry 104 may ensure that the first charge clocking signal 128 and the second charge clocking signal 126 are switched to opposite logic values. For example, after initialization, the first charge clocking signal 128 may be set to a logic high, setting the first flip/flop circuit 106 in a transparent mode, and the second charge clocking signal 126 may be set to logic low, setting the second flip/flop circuit 108 in a store mode. Thus, in an instance in which the input signal 130 switches states, the first flip/flop out signal 132 and the second flip/flop out signal 136 are different and the charging device in the charge detector circuitry 102 begins to charge. In an instance in which the input signal 130 switches back before the charge of the charging device exceeds the charge threshold of the switching device, the charging device is discharged and the charge signal 124 is not asserted. However, in an instance in which the input signal 130 remains in the switched state long enough for the charge of the charging device to exceed the charge threshold of the switching device, the charge signal 124 is updated (e.g., a logic zero is output). In such an instance, the clocking circuitry 104 updates the first charge clocking signal to a logic zero, putting the first flip/flop circuit 106 in a store state. The second charge clocking signal 126 is updated to a logic one, putting the second flip/flop circuit in a transparent state, and the value of the input signal 130 as stored in the first flip/flop circuit 106 is transmitted on the output signal 122. Thus, the output signal 122 represents a pulse filtered and delayed derivative of the input signal 130.

As further depicted in FIG. 1, the pulse filter and delay circuit 100 includes a first flip/flop circuit 106 and a second flip/flop circuit 108. The flip/flop circuits (e.g., first flip/flop circuit 106, second flip/flop circuit 108) comprise any level-triggered memory component, latching device, register, or similar storage mechanism configured to store a logic value at one or more outputs in an instance in which the flip/flop circuit is disabled (e.g., store mode) and transmit a logic value from an input to an output in an instance in which the flip/flop circuit is enabled (e.g., transparent mode). In some embodiments, a flip/flop circuit may include a clocked RS flip-flop, a level-triggered D flip-flop, or similar device.

For example, as depicted in FIG. 1, a flip/flop circuit may include three inputs, a signal input, an inverted signal input, and a clock input; and two outputs, a signal output, and an inverted signal output. In an instance in which the clock input is enabled, the flip/flop circuit is in a transparent mode, meaning the signal input is transmitted to the signal output, and the inverted signal input is transmitted to the inverted output signal. However, in an instance in which the clock input is disabled, the values at the output are stored, and do not change based on changes in the inputs.

As depicted in FIG. 1, the first charge clocking signal 128 is connected to the enable input of the first flip/flop circuit 106, while the input signal 130 is connected to the signal input of the first flip/flop circuit 106, and the logic NOT of the input signal 130 is connected to the inverted signal input of the first flip/flop circuit 106. The inverse signal output of the first flip/flop circuit 106 is connected to the first flip/flop inverse signal 134, and the signal output of the first flip/flop circuit 106 is connected to the first flip/flop out signal 132.

As depicted in FIG. 1, the second charge clocking signal 126 is connected to the enable input of the second flip/flop circuit 108, while the first flip/flop inverse signal 134 is connected to the signal input of the second flip/flop circuit 108, and the first flip/flop out signal 132 is connected to the inverted signal input of the second flip/flop circuit 108. The inverse signal output of the second flip/flop circuit 108 is connected to the output signal 122, and the signal output of the second flip/flop circuit 108 is connected to the second flip/flop out signal 136.

Figure 2:
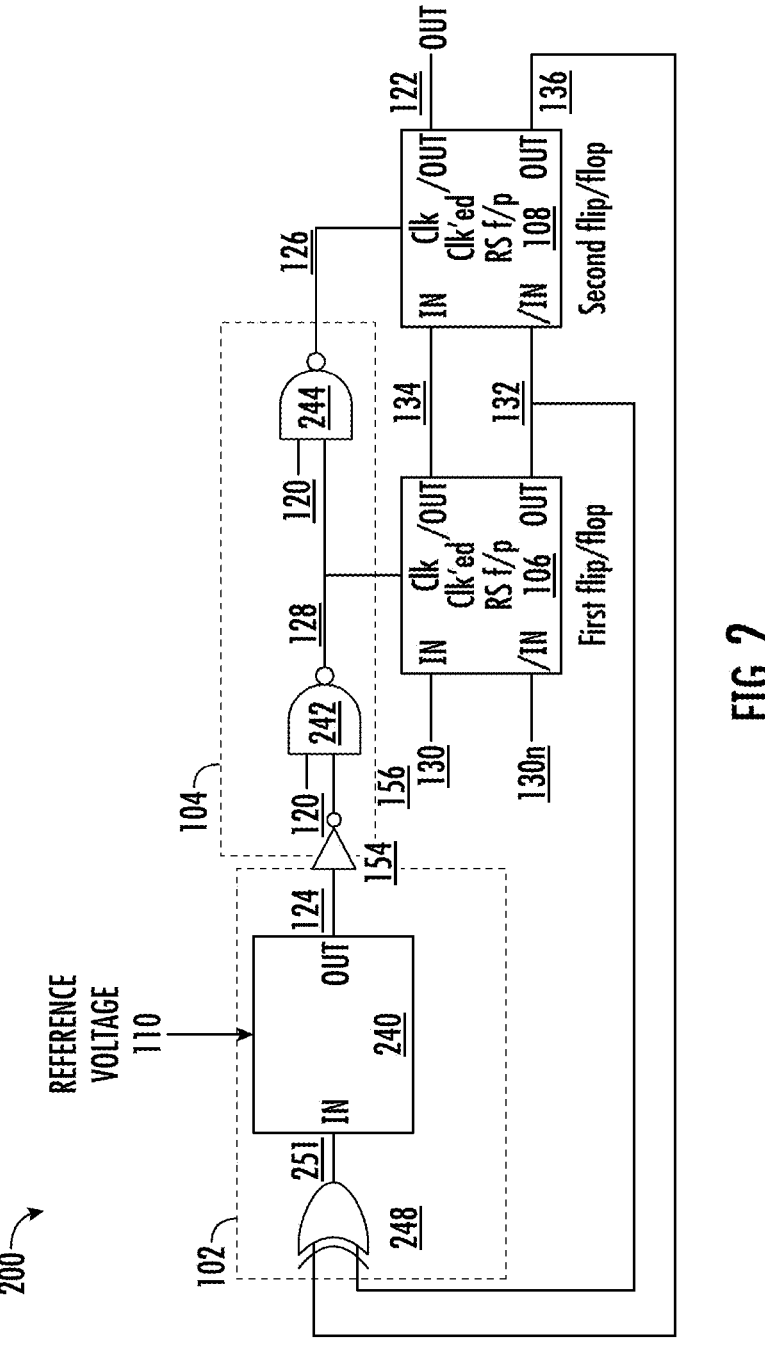
FIG. 2 depicts an example circuit schematic of an example pulse filter and delay circuit in accordance with an example embodiment of the present disclosure.

Referring now to FIG. 2, an example embodiment of a pulse filter and delay circuit 200 is provided. As depicted in FIG. 2, the example pulse filter and delay circuit 200 includes charge detector circuitry 102, clocking circuitry 104, first flip/flop circuit 106, and second flip/flop circuit 108.

As depicted in FIG. 2, the charge detector circuitry 102 configured to receive a reference voltage 110, a first flip/flop out signal 132 from a first flip/flop circuit 106, and a second flip/flop out signal 136 from a second flip/flop circuit 108, and generate a charge signal 124. The first flip/flop circuit 106 is configured to receive the input signal 130 (e.g., and complementary input signal 130n). In addition, the first flip/flop circuit 106 is configured to receive a first charge clocking signal 128 from clocking circuitry 104. The first flip/flop circuit 106 is configured to output the first flip/flop out signal 132 and a first flip/flop inverse signal 134. As further depicted in FIG. 2, the second flip/flop circuit 108 is configured to receive the first flip/flop inverse signal 134 and the first flip/flop out signal 132 from the first flip/flop circuit 106. The second flip/flop circuit 108 is further configured to receive a second charge clocking signal 126 from the clocking circuitry 104. The second flip/flop circuit 108 is configured to generate the second flip/flop out signal 136 and a second flip/flop inverse signal representing an inverted, pulse filtered, and delayed input signal 130. The output signal 122 is derived from the second flip/flop inverse signal. As further depicted in FIG. 2, the clocking circuitry 104 is configured to receive the inverted charge signal 156 from the inverter 154 based on the charge signal 124 of the charge detector circuitry 102, and a reset signal 120 (e.g., system reset signal, power on reset signal), and generate a first charge clocking signal 128 and a second charge clocking signal 126.

As further depicted in FIG. 2, the charge detector circuitry 102 includes an XOR logic gate 248 configured to perform a logic XOR operation on the first flip/flop out signal 132 and the second flip/flop out signal 136 to generate a capacitor discharge signal 251, configured to enable the charge of the capacitor device within the charge detector circuit 240.

As further depicted in FIG. 2, the clocking circuitry 104 comprises a first NAND logic gate 242 configured to receive the reset signal 120 at a first input and the inverted charge signal 156 at a second input and generate the first charge clocking signal 128 based on the logical NAND of the reset signal 120 and the inverted charge signal 156. The clocking circuitry 104 further comprises a second NAND logic gate 244 configured to receive the reset signal 120 at a first input and the first charge clocking signal 128 at a second input and generate the second charge clocking signal 126 based on the logical NAND of the reset signal 120 and first charge clocking signal 128. Thus, in an instance in which the reset signal 120 is asserted, and the pulse filter and delay circuit 200 is in an initialization state, both the first charge clocking signal 128 and the second charge clocking signal 126 are set to a logic one. In such an instance, the NAND logic gates 242, 244 have their outputs at one, forcing the first flip/flop circuit 106 and the second flip/flop circuit 108 into a transparent mode.

As further depicted in FIG. 2, the first flip/flop circuit 106 comprises a clocked RS flip-flop, comprising three inputs: a signal input (In), an inverted signal input (/In), and an enable input (clk); and two outputs, a signal output (Out), and an inverted signal output (/Out). As depicted in FIG. 2, the first charge clocking signal 128 is connected to the enable input of the first flip/flop circuit 106, while the input signal 130 is connected to the signal input of the first flip/flop circuit 106, and the logic NOT of the input signal 130 is connected to the inverted signal input of the first flip/flop circuit 106. The inverse signal output of the first flip/flop circuit 106 is connected to the first flip/flop inverse signal 134, and the signal output of the first flip/flop circuit 106 is connected to the first flip/flop out signal 132.

As depicted in FIG. 2, the second charge clocking signal 126 is connected to the enable input of the second flip/flop circuit 108, while the first flip/flop inverse signal 134 is connected to the signal input of the second flip/flop circuit 108, and the first flip/flop out signal 132 is connected to the inverted signal input of the second flip/flop circuit 108. The inverse signal output of the second flip/flop circuit 108 is connected to the output signal 122, and the signal output of the second flip/flop circuit 108 is connected to the second flip/flop out signal 136.

Figure 3A:
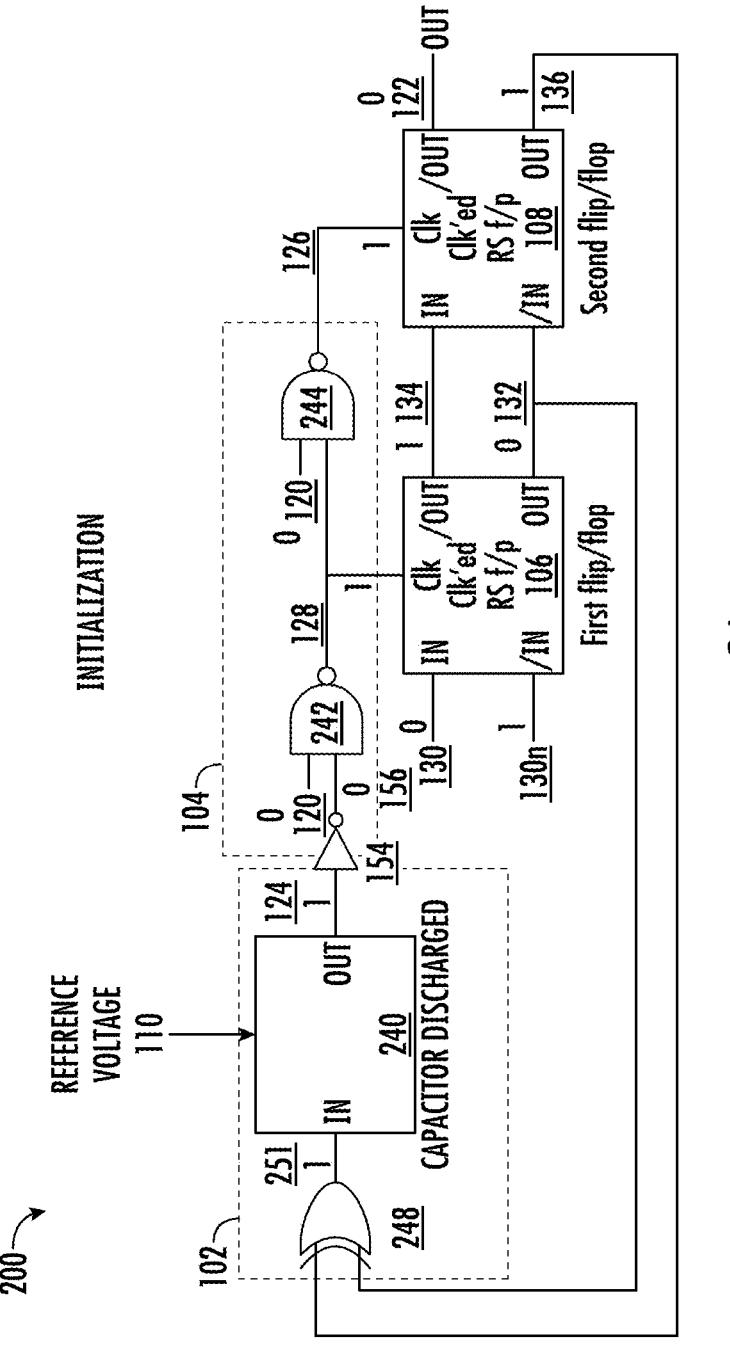
FIG. 3A depicts an initialization state of an example pulse filter and delay circuit in accordance with an example embodiment of the present disclosure.

Referring now to FIG. 3A, an example initialization process on the example pulse filter and delay circuit 200 is depicted.

In some embodiments, at power up, a functional block (not represented here) may generate a pulse at logic one on the power-on-reset or POR signal. The typical duration of the pulse is in the range of 100 nanoseconds to a few microseconds. The logic one of the power-on-reset signal may be inverted and correspond to a pulse at logic zero on the reset signal 120. As depicted in FIG. 3A, the logic zero of the reset signal 120 forces both the first charge clocking signal 128 and the second charge clocking signal 126 to a logic one, putting both the first flip/flop circuit 106 and the second flip/flop circuit 108 in transparent mode. With both the first flip/flop circuit 106 and the second flip/flop circuit 108 in transparent mode, the input signal 130 is equal to the first flip/flop out signal 132 which is equal to the output signal 122. Similarly, the complementary input signal 130n is equal to the first flip/flop inverse signal 134 which is equal to the second flip/flop out signal 136. With the first flip/flop out signal 132 not equal to the second flip/flop out signal 136, the capacitor discharge signal 251 is at a logic one and the charging device of the charge detector circuit 240 is not charging. Thus, the charge signal 124 is also a logic one.

Figure 3B:
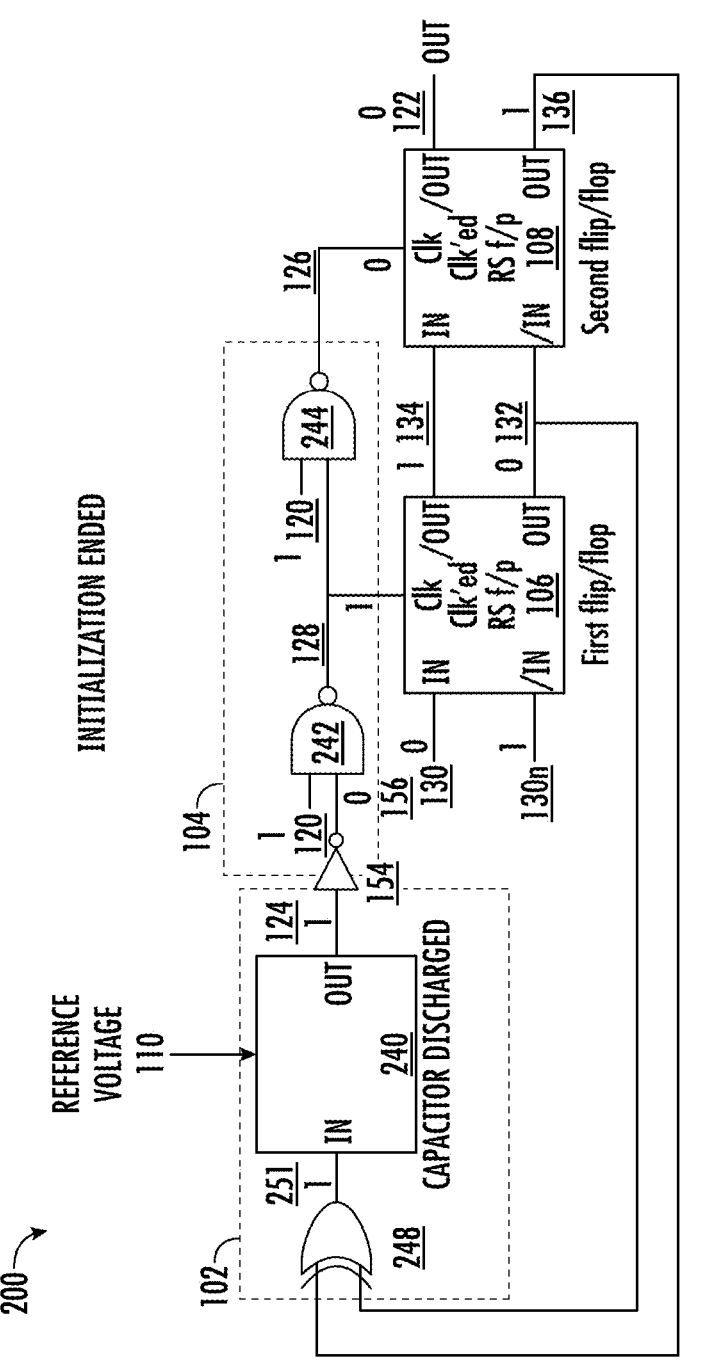
FIG. 3B depicts completion of an initialization state of an example pulse filter and delay circuit in accordance with an example embodiment of the present disclosure.

Referring now to FIG. 3B, the end of the initialization process of the example pulse filter and delay circuit 200 is provided. As depicted in FIG. 3B, the reset signal 120 is driven to a logic one (e.g., inverse of power-on-reset signal). Once the reset signal 120 is driven to a logic one, the first NAND logic gate 242 and the second NAND logic gate 244 act as inverters. Thus, the first charge clocking signal 128 corresponding with the enable input of the first flip/flop circuit 106 is set to logic 1 (e.g., transparent mode). However, the second charge clocking signal 126 is set to a logic zero and the second flip/flop circuit 108 is in a store mode, meaning changes to the inputs at the second flip/flop circuit 108 are not transmitted to the outputs until the second flip/flop circuit 108 is enabled.

As long as the input signal 130 does not change, the first flip/flop out signal 132 does not change, and the capacitor discharge signal 251 does not change, so the charging device in the charge detector circuit 240 remains discharged.

Figure 3C:
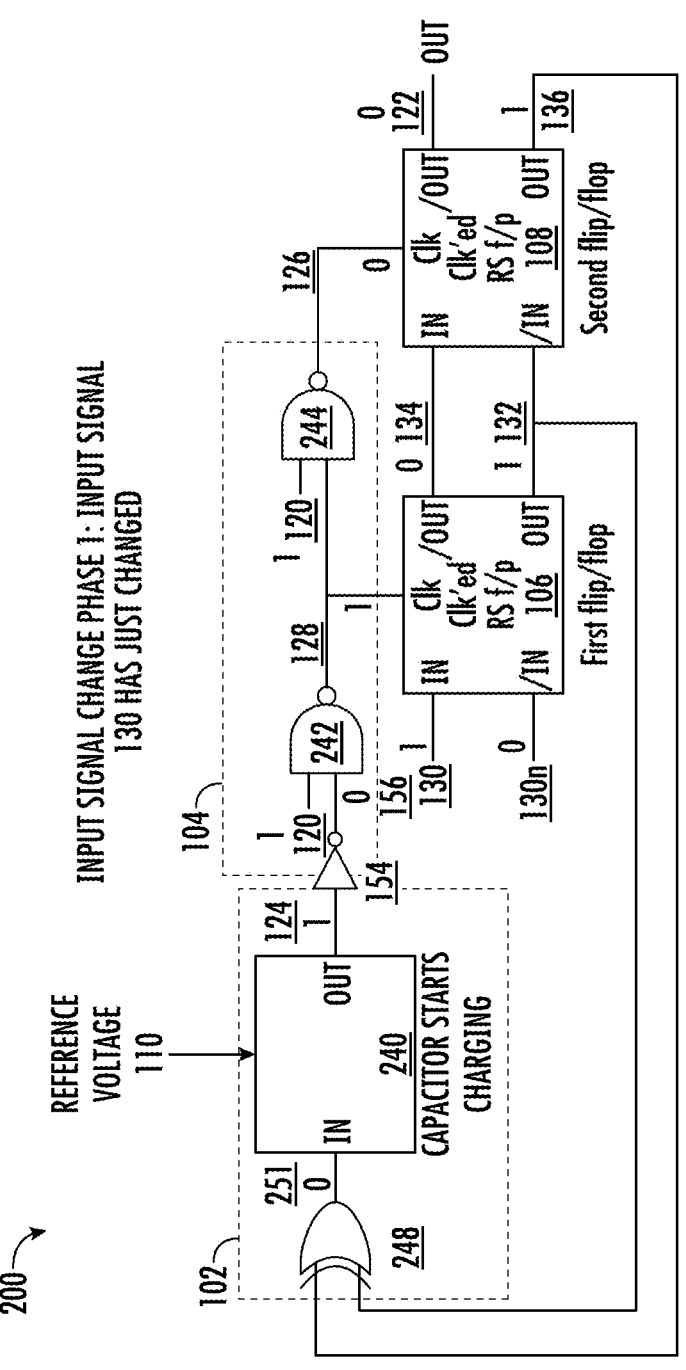
FIG. 3C depicts a first phase of an example input signal change in accordance with an example embodiment of the present disclosure.

Referring now to FIG. 3C, a first phase, occurring just after the input signal 130 has changed, is depicted. As depicted in FIG. 3C, in an instance in which the input signal 130 is driven to a logic one, the first flip/flop out signal 132 is updated to a logic one. However, the second flip/flop circuit 108 is in store mode, so the second flip/flop out signal 136 is unchanged. Thus, the capacitor discharge signal 251 is set to a logic zero and the charging device in the charge detector circuit 240 begins to charge.

Figure 3D:
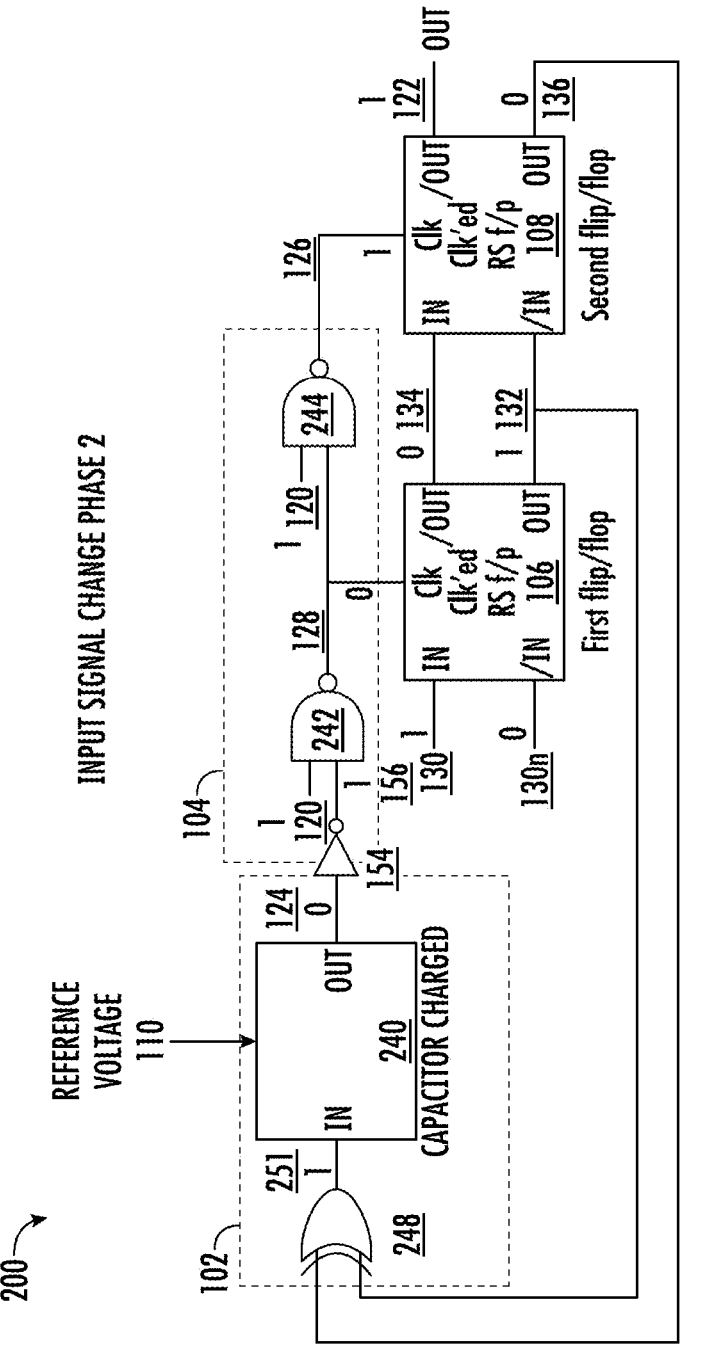
FIG. 3D depicts a second phase of an example input signal change on a pulse filter and delay circuit in accordance with an example embodiment of the present disclosure.

Referring now to FIG. 3D, a second phase in which the input signal 130 remains until after the charging device (e.g., capacitor) within the charge detector circuit is completely charged. As depicted in FIG. 3D, after the charge of the charging device exceeds the charge threshold of the switching device within the charge detector circuit 240 the charge signal 124 is updated to a logic zero. With the charge signal 124 at a logic zero and the inverted charge signal 156 at logic one, the first charge clocking signal 128 is updated to a logic zero, setting the first flip/flop circuit 106 in storage mode. The second charge clocking signal 126 is updated to a logic one, setting the second flip/flop circuit 108 in transparent mode. With the second flip/flop circuit 108 in transparent mode, the change in the input signal 130 is output as a logic one on the output signal 122. Thus, a rising edge of the input signal 130 is filtered and delayed by the pulse filter and delay circuit 200. In addition to the output signal 122 changing, the second flip/flop out signal 136 also changes, and the XOR of the first flip/flop out signal 132 and the second flip/flop out signal 136 changes. Such a change causes the capacitor discharge signal 251 to go to a logic one, starting the discharge of the charging device in the charge detector circuit 240.

Figure 3E:
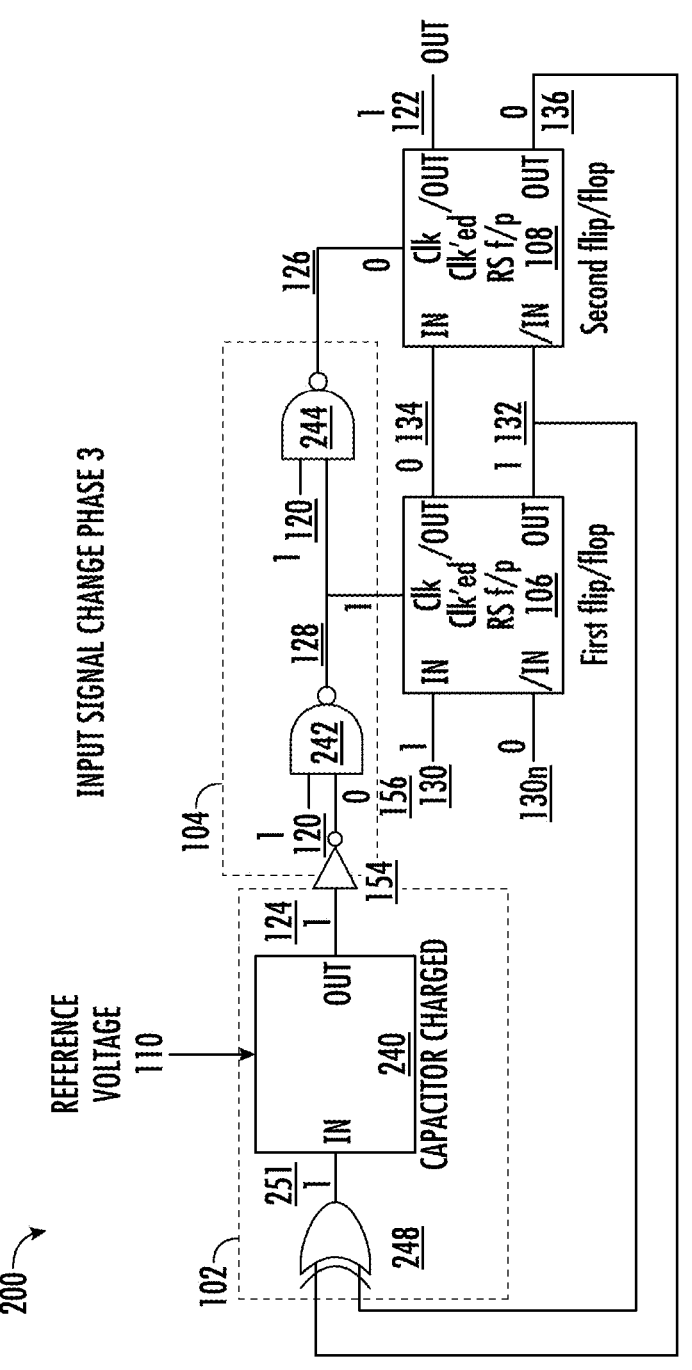
FIG. 3E depicts a third phase of an example input signal change on a pulse filter and delay circuit in accordance with an example embodiment of the present disclosure.

Referring now to FIG. 3E, a third phase in which the charging device in the charge detector circuit 240 is fully discharged. As depicted in FIG. 3E, once the charge of the charging device drops below the charge threshold of the switching device within the charge detector circuit 240 the charge signal 124 is updated to a logic one. With the charge signal 124 at a logic one and the inverted charge signal 156 at logic zero, the first charge clocking signal 128 is updated to a logic one, setting the first flip/flop circuit 106 in transparent mode. The second charge clocking signal 126 is updated to a logic zero, setting the second flip/flop circuit 108 in store mode. Thus, the first flip/flop circuit 106 (e.g., transparent mode) and the second flip/flop circuit 108 (e.g., store mode) are in the same state as in FIG. 3B, however, the input signal 130 is now at a logic one. Thus, a change in the input signal 130 from logic one to logic zero triggers the charging device within the charge detector circuit 240 to charge again. In an instance in which the change in the input signal 130 remains long enough to trigger the switching device within the charge detector circuit 240, and switch the charge signal 124, the change in the input signal 130 is output at the output signal 122. In this way, the pulse filter and delay circuit 200 detects both rising and falling transitions in an input signal 130.

Figure 3F:
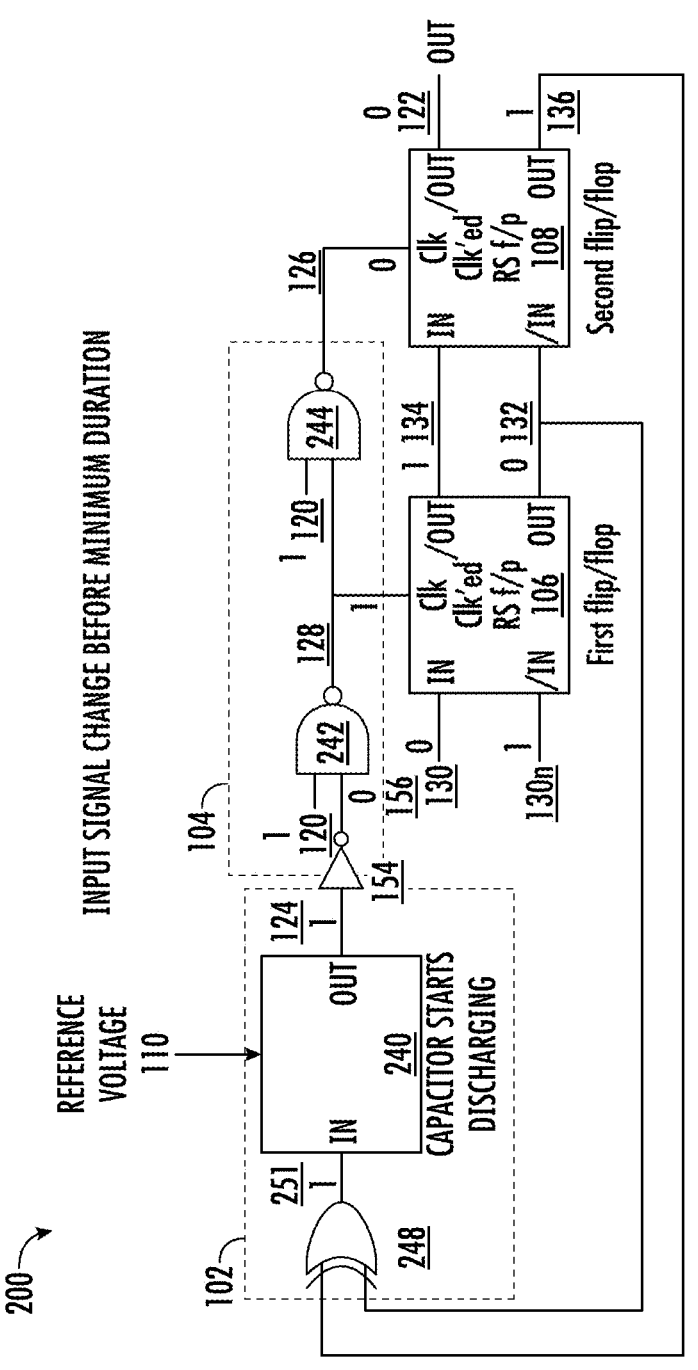
FIG. 3F depicts a fourth phase of an example input signal change on a pulse filter and delay circuit in accordance with an example embodiment of the present disclosure.

Referring now to FIG. 3F, an instance in which the input signal switches back before the charge signal 124 changes is depicted. FIG. 3F depicts an instance in which the input signal 130 switches back before the charging device within the charge detector circuit 240 switches back before the charge at the charging device exceeds the threshold voltage of the switching device within the charge detector circuit 240. FIG. 3F is depicted as if following the FIG. 3C. As depicted in FIG. 3F, the input signal 130 returns to a logic zero, before the charge signal 124 switches to a logic zero. Thus, the charge clocking signal 128 remains at 1 and the first flip/flop circuit 106 remains in a transparent mode. In a transparent mode, the first flip/flop out signal 132 changes with the input signal 130 to a logic zero and the first flip/flip inverse signal 134 updates to a logic one. Because the first flip/flip inverse signal 134 (e.g., logic zero) is different than the second flip/flop out signal 136, the capacitor discharge signal 251 is set to 1 and the charging device within the charge detector circuit 240 begins to discharge, and the charge signal 124 never switches. Since the input signal 130 switched back before the charging device within the charge detector circuit 240 was charged sufficiently to switch the switching device within the charge detector circuit 240, the change in input signal 130 is never output.

Figure 5:
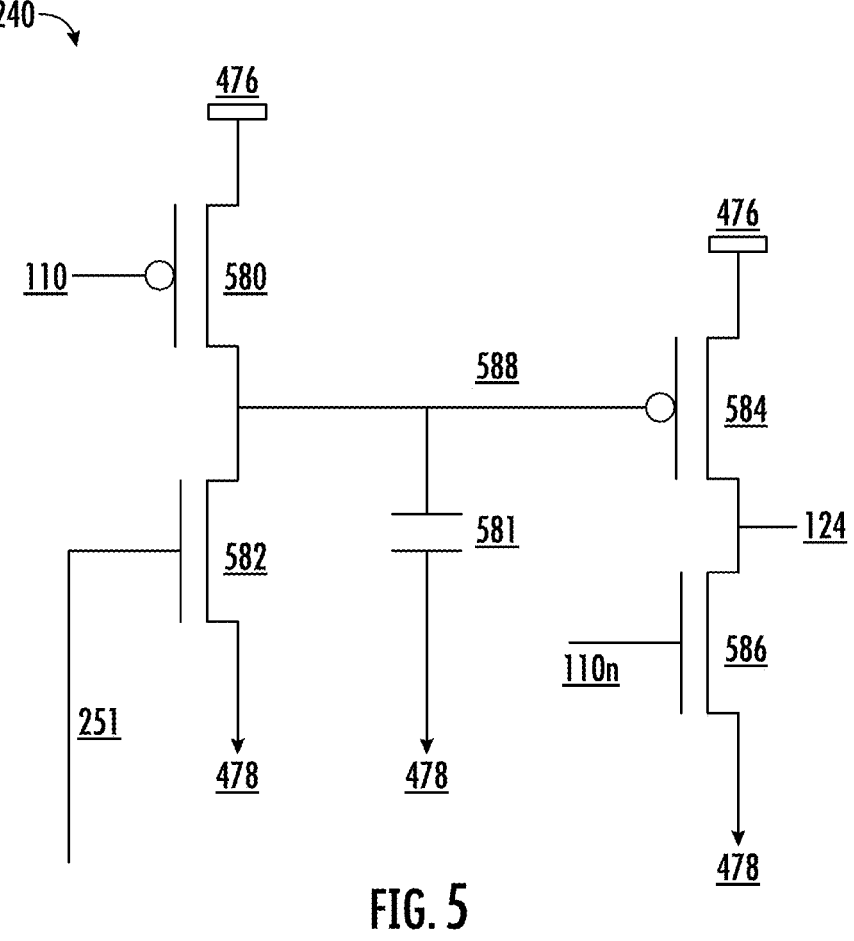
FIG. 5 depicts an example circuit schematic of an example charge detector in accordance with an example embodiment of the present disclosure.

As described in relation to FIG. 4 and FIG. 5, the time required to charge the charging device above the charge threshold of the switching device within the charge detector circuit 240 depends on the charging device and the reference voltage 110. However, although not depicted in FIG. 3B and FIG. 3C, in an instance in which the input signal 130 changes (e.g., back to a logic 0) before the charge of the charging device exceeds the charge threshold of the switching device within the charge detector circuit 240, the capacitor discharge signal 251 is returned to a logic one and the charging device discharged before the charge signal 124 is updated.

Referring now to FIG. 4, an example reference voltage source 471 configured to generate the reference voltage 110 and complementary reference voltage 110n is provided. In general, the reference voltage 110 is the voltage that must be applied to the gate of the first PMOS transistor 462 to sink the reference current into resistor 464.

As further depicted in FIG. 4, a reference current ($I_{REF}$) (e.g., current source) is generated through the resistor 464. Provided the detection of charge of the capacitor varies the same way as the current source versus supply source voltage 476, both variations compensate mutually, and the charging time of the charging device of the charge detector circuit 240 is independent of the supply source voltage 476. An example reference voltage source 471 is depicted in FIG. 4. As depicted in FIG. 4, a source terminal of a first PMOS transistor 462 is electrically connected to a source voltage 476. The drain terminal of the first PMOS transistor 462 is diode connected to the gate terminal of the first PMOS transistor 462. A source terminal of a second PMOS transistor 460 is also connected to the source voltage 476. The drain terminal of the second PMOS transistor 460 is further electrically connected to the drain terminal of the first PMOS transistor 462. The gate terminal of the second PMOS transistor is electrically connected to a gate terminal of a first NMOS transistor 474. As further depicted in FIG. 4, the reference voltage source 471 includes a resistor 464 having a first terminal electrically connected to the drain terminal of the first PMOS transistor 462 and the drain terminal of the second PMOS transistor 460; and a second terminal electrically connected to a drain terminal of the first NMOS transistor 474. The source terminal of the first NMOS transistor 474 is electrically connected to ground 478.

As further depicted in FIG. 4, the reference voltage source 471 includes a third PMOS transistor 466, wherein the gate terminal of the third PMOS transistor 466 is electrically connected to the drain terminal of the first PMOS transistor 462 and the drain terminal of the second PMOS transistor 460. The reference voltage 110 is derived from the net point 473 at which the drain terminal of the first PMOS transistor 462, the gate terminal of the first PMOS transistor 462, the drain terminal of the second PMOS transistor 460, the first terminal of the resistor 464, and the gate terminal of the third PMOS transistor 466 are all electrically connected. The source terminal of the third PMOS transistor 466 is electrically connected to the source voltage 476. In addition, the drain terminal of the third PMOS transistor 466 is electrically connected to the drain terminal of a second NMOS transistor 470 and the drain terminal of a third NMOS transistor 468.

As depicted in FIG. 4, the third NMOS transistor 468 is diode connected with the gate terminal of the third NMOS transistor 468 electrically connected to the drain terminal of the third NMOS transistor 468. The complementary reference voltage 110n is derived from the net point 475 at which the drain terminal of the third PMOS transistor 466, the drain terminal of the second NMOS transistor 470, the drain terminal of the third NMOS transistor 468, and the gate terminal of the third NMOS transistor 468 all electrically connect. Both the source terminal of the second NMOS transistor 470 and the source terminal of the third NMOS transistor 468 are electrically connected to ground 478. The complementary reference current ($I_{REFN}$) is the current flowing from the drain terminal of the third PMOS transistor 466 through the drain terminal of the third NMOS transistor 468 to the ground 478.

As further depicted in FIG. 4, the reference voltage source 471 includes an inverter 472 with an input terminal electrically connected to the gate terminal of the second NMOS transistor 470 and an output electrically connected to the gate terminal of the first NMOS transistor 474.

The role of the inverter 472, first NMOS transistor 474, and second PMOS transistor 460 is to enable or disable the reference current. If the input of inverter 472 is high, the output is low, turning the first NMOS transistor 474 off and causing the bottom node of resistor 464 to float, such that no current flows into resistor 464. At the same time second PMOS transistor 460 is ON, and net point 473 is set to the power supply voltage of source voltage 476. Further, third PMOS transistor 466 is off and no current flows into third NMOS transistor 468, while second NMOS transistor 470 is ON. So net point 475 is at the ground potential of ground 478.

If the input of inverter 472 is high, the reference voltage source 471 is disabled, there is no consumption in the reference voltage source 471, and any current mirrored from first PMOS transistor 462 or from third NMOS transistor 468 will be zero. If the input of inverter 472 is low, the reference voltage source 471 and the reference current ($I_{REF}$) are enabled.

In a first option, the input of inverter 472 is permanently at logic low, and the reference voltage source 471 and the reference current ($I_{REF}$) are always active. In a second option, the reference voltage source 471 and the reference current ($I_{REF}$) are disabled when the charging device of the charge detector circuitry 102 is being discharged (e.g., capacitor discharge signal 251 of FIG. 5 is at a logic high), and enabled when the charging device of the charge detector circuitry 102 is being charged (e.g., capacitor discharge signal 251 of FIG. 5 is at logic low). To enable the second option the input of inverter 472 may be connected to the capacitor discharge signal 251. The second option is more energy efficient as the reference voltage source 471 and the reference current ($I_{REF}$) are only enabled when needed to charge the charging device of the charge detector circuitry 102.

As depicted in FIG. 4, a reference current ($I_{REF}$) through the resistor 464 is dependent upon the source voltage 476, the threshold voltage of the first PMOS transistor 462 and the resistor 464. For example, the reference current may be equivalent to:

$$I_{REF} = \frac{V_{DD} - V_T}{R}$$

where $I_{REF}$ is the reference current, $V_{DD}$ is the source voltage 476, $V_T$ is the threshold voltage of the first PMOS transistor 462, and R is the resistance of the resistor 464. As described in conjunction with FIG. 5, the time required to charge the charging device in a charge detection circuit is dependent on the reference voltage 110, the reference current ($I_{REF}$), and more specifically on the resistance of the resistor 464.

Referring now to FIG. 5, an example charge detector circuit 240 is provided. As depicted in FIG. 5, the example charge detector circuit 240 includes a charging capacitor 581 (e.g., charging device) comprising a first terminal electrically connected to ground 478, and a second terminal electrically connected to a net point 588.

As further depicted in FIG. 5, the example charge detector circuit 240 includes a first PMOS transistor 580 electrically connected in series with a first NMOS transistor 582, wherein the source terminal of the first PMOS transistor 580 is electrically connected to a source voltage 476 and the drain terminal of the first PMOS transistor 580 is electrically connected to the net point 588. As further depicted, the drain terminal of the first NMOS transistor 582 is electrically connected to the net point 588 and the source terminal of the first NMOS transistor 582 is electrically connected to ground 478.

As further depicted in FIG. 5, the gate terminal of the first PMOS transistor 580 is electrically connected to the reference voltage 110. The current flowing through the first PMOS transistor 580 thus acts as a current mirror to the reference current ($I_{REF}$). As depicted in FIG. 5, the gate terminal of the first NMOS transistor 582 is electrically connected to the capacitor discharge signal 251. Thus, in an instance in which the capacitor discharge signal 251 is set high, the first NMOS transistor 582 discharges the capacitor 581. Further, when the capacitor discharge signal 251 is low, first NMOS transistor 582 is off and first PMOS transistor 580 charges the capacitor 581 under reference current $I_{REF}$.

As further depicted in FIG. 5, the example charge detector circuit 240 includes a second PMOS transistor 584 electrically connected in series with a second NMOS transistor 586, wherein the source terminal of the second PMOS transistor 584 is electrically connected to a source voltage 476 and the drain terminal of the second PMOS transistor 584 is electrically connected to the drain terminal of the second NMOS transistor 586. The source terminal of the second NMOS transistor is electrically connected to ground 478.

As further depicted in FIG. 5, the gate terminal of the second PMOS transistor 584 is electrically connected to the net point 588 and the gate terminal of the second NMOS transistor 586 is electrically connected to the complementary reference voltage 110n. In an instance in which the second PMOS transistor 584 is enabled, the second NMOS transistor 586 acts as a current mirror to the complementary reference current ($I_{REFN}$) depicted in FIG. 4. The charge signal 124 is generated at the electrical connection of the drain terminal of the second PMOS transistor 584 and the drain terminal of the second NMOS transistor 586.

As depicted in FIG. 5, in an instance in which the first NMOS transistor 582 is enabled, for example, when the first flip/flop out signal (e.g., first flip/flop out signal 132) and the second flip/flop out signal (e.g., second flip/flop out signal 136) are different, the charging capacitor 581 is discharged. However, in an instance in which the first NMOS transistor 582 is disabled, for example, when the first flip/flop out signal (e.g., first flip/flop out signal 132) and the second flip/flop out signal (e.g., second flip/flop out signal 136) are the same, the charging capacitor 581 begins to charge in accordance with the reference voltage 110 and reference current ($I_{REF}$). The charging capacitor 581 will continue to charge (as long as the first NMOS transistor 582 is disabled) until the voltage at the net point 588 exceeds the source voltage 476 minus the threshold voltage of the second PMOS transistor 584. Once the charge of the net point 588 exceeds the source voltage 476 minus threshold voltage of the second PMOS transistor 584, the second PMOS transistor 584 is disabled and the charge signal 124 goes low (e.g., to ground 478). In an instance in which the charging capacitor is discharging (e.g., as long as the first NMOS transistor 582 is enabled), once the charge of the net point 588 is below the source voltage 476 minus the threshold voltage of the second PMOS transistor 584, the second PMOS transistor 584 is enabled and electric flow from the source voltage 476 causes the charge signal 124 to go high.

The time required to charge the net point 588 to a voltage that exceeds the source voltage 476 minus the threshold voltage of the second PMOS transistor 584 defines the minimum threshold pulse width of the input signal 130 of a pulse filter and delay circuit. Such a charge time (e.g., minimum threshold pulse width) may be defined by the reference voltage 110 (e.g., reference current $I_{REF}$) and the charging capacitor 581. For example, in some instances, the charge time is proportional to the capacitance of the charging capacitor 581, and the resistance of the resistor comprising the reference voltage source (e.g., resistor 464 as described in relation to FIG. 4.

Figure 8:
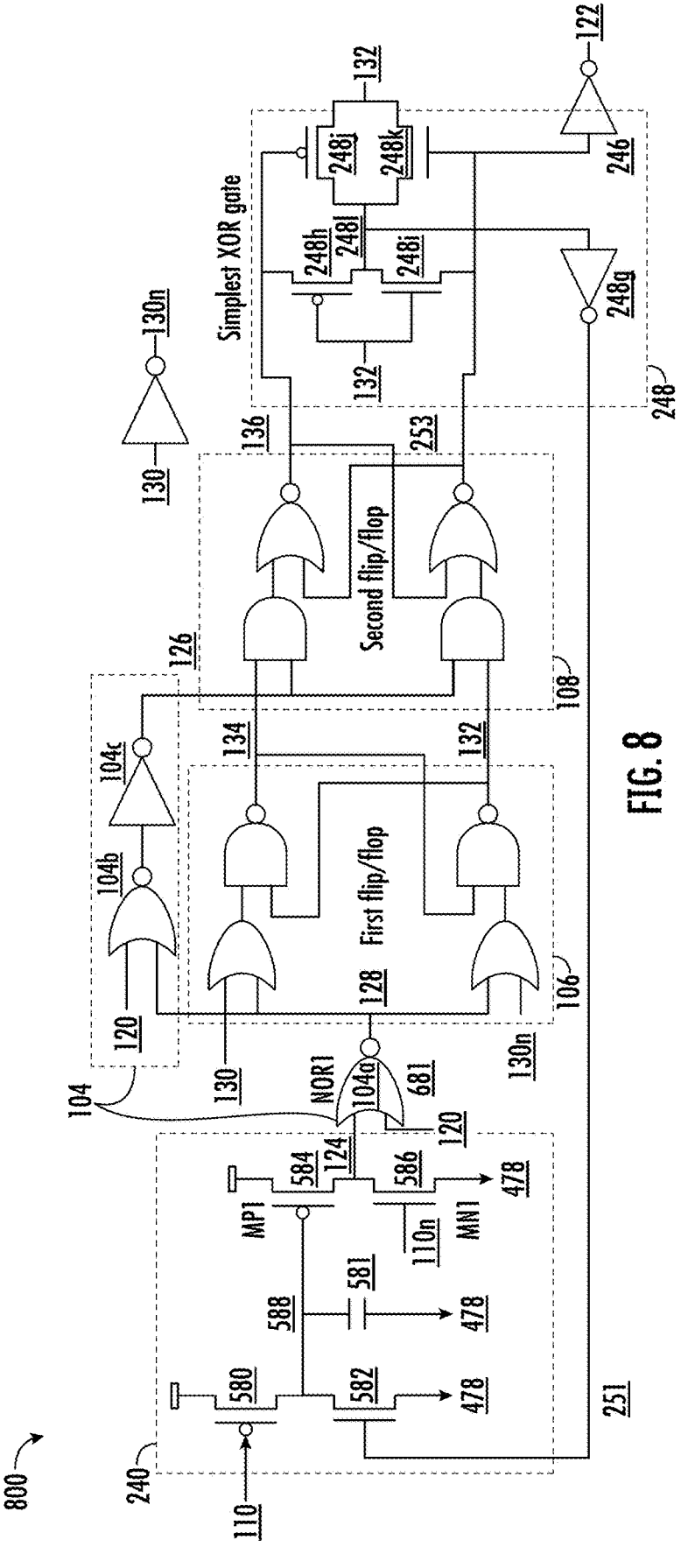
FIG. 8 depicts an example circuit schematic of an example embodiment of a pulse filter and delay circuit in accordance with an example embodiment of the present disclosure.
Figure 9:
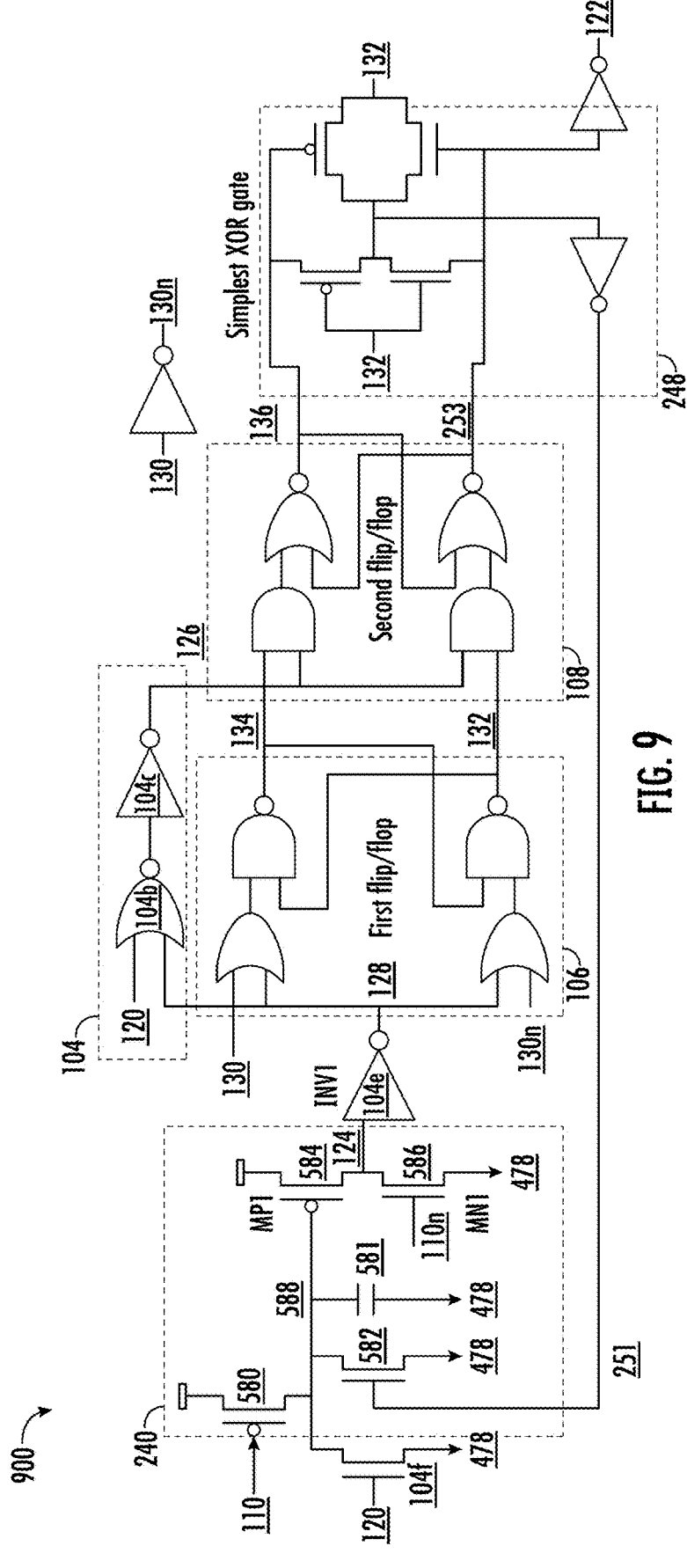
FIG. 9 depicts an example circuit schematic of an example embodiment of a pulse filter and delay circuit in accordance with an example embodiment of the present disclosure.
Figure 10:
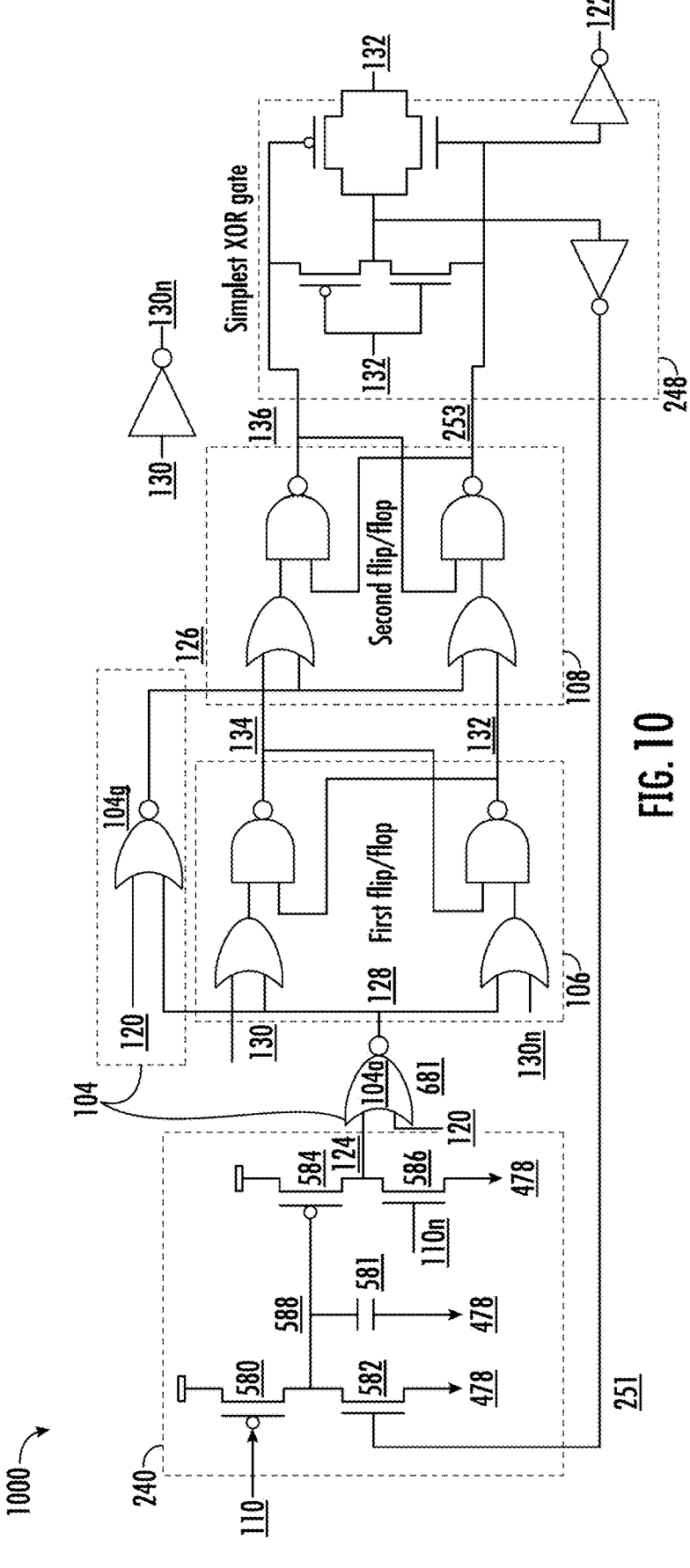
FIG. 10 depicts an example circuit schematic of an example embodiment of a pulse filter and delay circuit in accordance with an example embodiment of the present disclosure.
Figure 11:
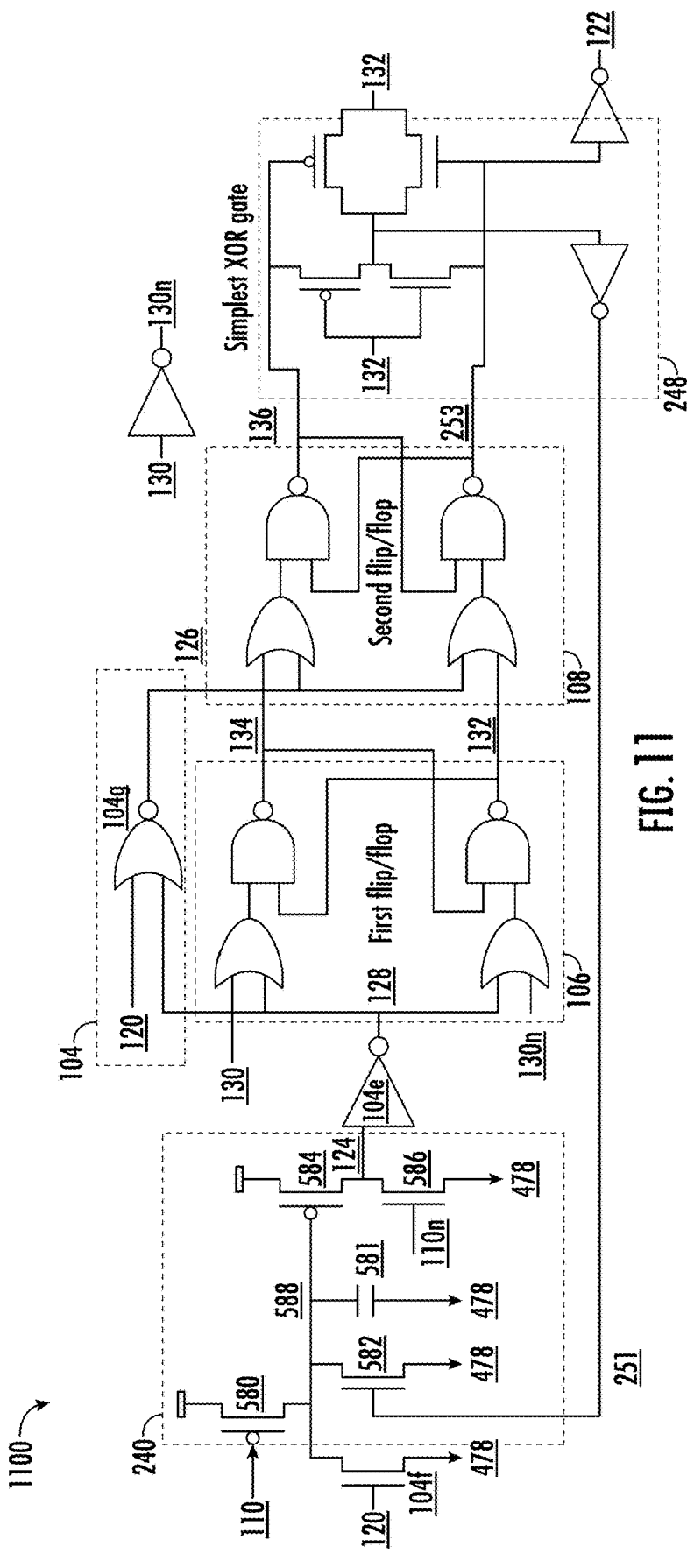
FIG. 11 depicts an example circuit schematic of an example embodiment of a pulse filter and delay circuit in accordance with an example embodiment of the present disclosure.

Referring now to FIG. 6-FIG. 11, various practical implementations of a pulse filter and delay circuit (e.g., pulse filter and delay circuit 100, 200) are provided. The various circuitries of the pulse filter and delay circuit may be implemented in many forms. For example, the flip/flop circuits, clocking circuitry, reset logic, logic functions, charge detector, and reference voltage source may be implemented using various techniques. FIG. 6-FIG. 12 provide various non-limiting techniques for implementing the functionality of the pulse filter and delay circuit. Although the principal operation is the same, several signal polarities differ between FIG. 2, and FIG. 6-FIG. 12. For example, in FIG. 2, the first flip/flop circuit 106 and the second flip/flop circuit 108 are in transparent mode when the charge clocking signals 126, 128 are at one, and in a storage mode when the charge clocking signals 126, 128 are at zero. In FIG. 6-FIG. 12, the first flip/flop circuit 106 is in transparent mode when the first charge clocking signal 128 is at zero, and in storage mode when the first charge clocking signal 128 is at one. In FIG. 10-FIG. 11, the second flip/flop circuit 108 is in transparent mode when the second charge clocking signal 126 is at zero, and in storage mode when the second charge clocking signal 126 is at one. In FIGS. 6, 7, 8, 9, and 12, the second flip/flop circuit 108 is in transparent mode when the second charge clocking signal 126 is at one, and in storage mode when the second charge clocking signal 126 is at zero.

In addition, in FIG. 6-FIG. 12, the reset signal 120 applies a reset at logic high, unlike FIG. 2 and FIG. 3A-FIG. 3F in which the reset signal 120 applied a reset when at logic low. The reset signal 120 in FIG. 6-FIG. 12 applies a reset at logic high since reset signal 120 is transmitted to NOR logic gates (e.g., NOR logic gates 104a, 104b) in FIG. 6-FIG. 12, while transmitted to NAND logic gates (e.g., NAND logic gates 242, 244) in FIG. 2-FIG. 3.

Figure 6:
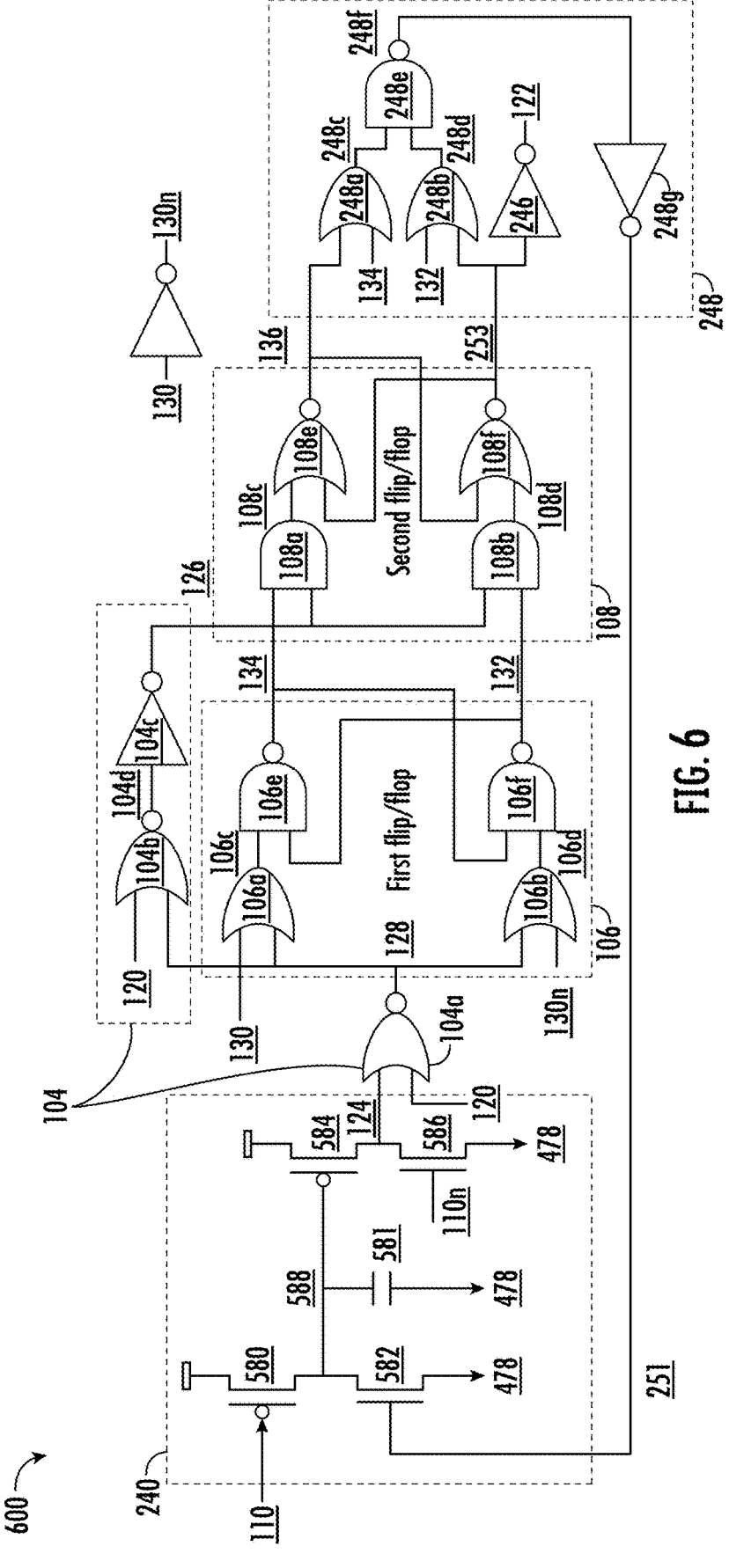
FIG. 6 depicts an example circuit schematic of an example embodiment of a pulse filter and delay circuit in accordance with an example embodiment of the present disclosure.

Referring now to FIG. 6, an example circuit diagram of an example embodiment of a pulse filter and delay circuit 600 is provided. As depicted in FIG. 6, the example pulse filter and delay circuit 600 includes charge detector circuitry comprising an XOR logic gate 248 and a charge detector circuit 240, clocking circuitry 104, first flip/flop circuit 106, and second flip/flop circuit 108.

As depicted in FIG. 6, the charge detector circuit 240 is configured to receive a reference voltage 110, and a capacitor discharge signal 251 from the XOR logic gate 248. Any transistor receiving the reference voltage 110 at its gate will mirror the reference current ($I_{REF}$) through the transistor. Although previously depicted adjacent to the charge detector circuit 240, for visual simplicity, the logic comprising the XOR logic gate 248 is depicted separately. The charge detector circuit 240 generates a charge signal 124 based on the reference voltage 110 and the capacitor discharge signal 251.

As further depicted in FIG. 6, the XOR logic gate 248 is configured to receive the first flip/flop out signal 132 and the first flip/flop inverse signal 134. In addition, the XOR logic gate 248 receives the second flip/flop out signal 136 and the second flip/flop inverse signal 253. The XOR logic gate 248 performs a logic XOR function on the first flip/flop out signal 132 and the second flip/flop out signal 136 to generate the capacitor discharge signal 251. For convenience, output signal 122 generated by the pulse filter and delay circuit 600 is depicted within the XOR logic gate 248 and is based on the second flip/flop inverse signal 253.

As further depicted in FIG. 6, the first flip/flop circuit 106 is configured to receive the input signal 130 (e.g., and complementary input signal 130n). In addition, the first flip/flop circuit 106 is configured to receive a first charge clocking signal 128 from clocking circuitry 104. The first flip/flop circuit 106 is configured to output the first flip/flop out signal 132 and a first flip/flop inverse signal 134.

As further depicted in FIG. 6, the second flip/flop circuit 108 is configured to receive the first flip/flop inverse signal 134 and the first flip/flop out signal 132 from the first flip/flop circuit 106. The second flip/flop circuit 108 is further configured to receive a second charge clocking signal 126 from the clocking circuitry 104. The second flip/flop circuit 108 is configured to generate the second flip/flop out signal 136 and the second flip/flop inverse signal 253 representing an inverted, pulse filtered, and delayed input signal 130. The output signal 122 is output as the logical NOT (e.g., logic NOT gate 246) of the second flip/flop inverse signal 253.

As further depicted in FIG. 6, the clocking circuitry 104 is configured to receive the charge signal 124 from the charge detector circuit 240 and a reset signal 120 (e.g., system reset signal, power on reset signal), and generate a first charge clocking signal 128 and a second charge clocking signal 126. For convenience and simplicity, the clocking circuitry 104 is depicted in separate portions, a first portion comprising the NOR logic gate 104a, and a second portion comprising the NOR logic gate 104b and the inverter 104c.

As further depicted in FIG. 6, the charge detector circuit 240 is configured in accordance with FIG. 5, including a first PMOS transistor 580 electrically connected in series with a first NMOS transistor 582, wherein the first PMOS transistor 580 is configured to receive the reference voltage 110, and the first NMOS transistor 582 is configured to receive the capacitor discharge signal 251 at its gate terminal. The charge detector circuit 240 further comprising a second PMOS transistor 584 electrically connected in series with a second NMOS transistor 586, wherein the gate terminal of the second PMOS transistor 584 is electrically connected to the net point 588, and the gate terminal of the second NMOS transistor 586 is electrically connected to the complementary reference voltage 110n. The charge detector circuit 240 further comprising a charging capacitor 581 electrically connected to the net point 588, wherein the charging capacitor 581 is configured to charge the gate terminal of the second PMOS transistor 584 based on the capacitance of the charging capacitor 581, the reference voltage 110, and the reference current ($I_{REF}$).

As further depicted in FIG. 6, the clocking circuitry 104 includes a NOR logic gate 104a configured to receive the charge signal 124 from the charge detector circuit 240 and the reset signal 120 and generate a first charge clocking signal 128. The clocking circuitry 104 further includes a second NOR logic gate 104b configured to receive the first charge clocking signal 128 and the reset signal 120 and generate an output 104d. The clocking circuitry 104 further comprising an inverter 104c configured to receive the output 104d and generate the second charge clocking signal 126.

As further depicted in FIG. 6, the first flip/flop circuit 106 comprises a first OR logic gate 106a configured to receive the input signal 130 and the first charge clocking signal 128, and generate a first OR output 106c. The first flip/flop circuit 106 further comprises a second OR logic gate 106b configured to receive the complementary input signal 130n and the first charge clocking signal 128, and generate a second OR output 106d. The first flip/flop circuit 106 further comprises a first NAND logic gate 106e configured to receive the first OR output 106c and the first flip/flop out signal 132, and generate the first flip/flop inverse signal 134. The first flip/flop circuit 106 further comprises a second NAND logic gate 106f configured to receive the second OR output 106d and the first flip/flop inverse signal 134, and generate first flip/flop out signal 132.

As further depicted in FIG. 6, the second flip/flop circuit 108 comprises a first AND logic gate 108a configured to receive the first flip/flop inverse signal 134 and the second charge clocking signal 126, and generate a first AND output 108c. The second flip/flop circuit 108 further comprises a second AND logic gate 108b configured to receive the first flip/flop out signal 132 and the second charge clocking signal 126, and generate a second AND output 108d. The second flip/flop circuit 108 further comprises a first NOR logic gate 108e configured to receive the first AND output 108c and the second flip/flop inverse signal 253, and generate the second flip/flop out signal 136. The second flip/flop circuit 108 further comprises a second NOR logic gate 108f configured to receive the second AND output 108d and the second flip/flop out signal 136, and generate the second flip/flop inverse signal 253.

As further depicted in FIG. 6, the XOR logic gate 248 is configured with a first OR logic gate 248a configured to receive the second flip/flop out signal 136 and the first flip/flop inverse signal 134, and generate a first OR output signal 248c. The XOR logic gate 248 further includes a second OR logic gate 248b configured to receive the second flip/flop inverse signal 253 and the first flip/flop out signal 132 and generate a second OR output signal 248d. As further depicted in FIG. 6, the XOR logic gate 248 further includes a first NAND logic gate 248c configured to receive the first OR output signal 248c and the second OR output signal 248d and generate an XOR output signal 248f, representing the XOR between the first flip/flop out signal 132 and the second flip/flop out signal 136. The XOR output signal 248f is passed through an inverter 248g to obtain the capacitor discharge signal 251.

Figure 7:
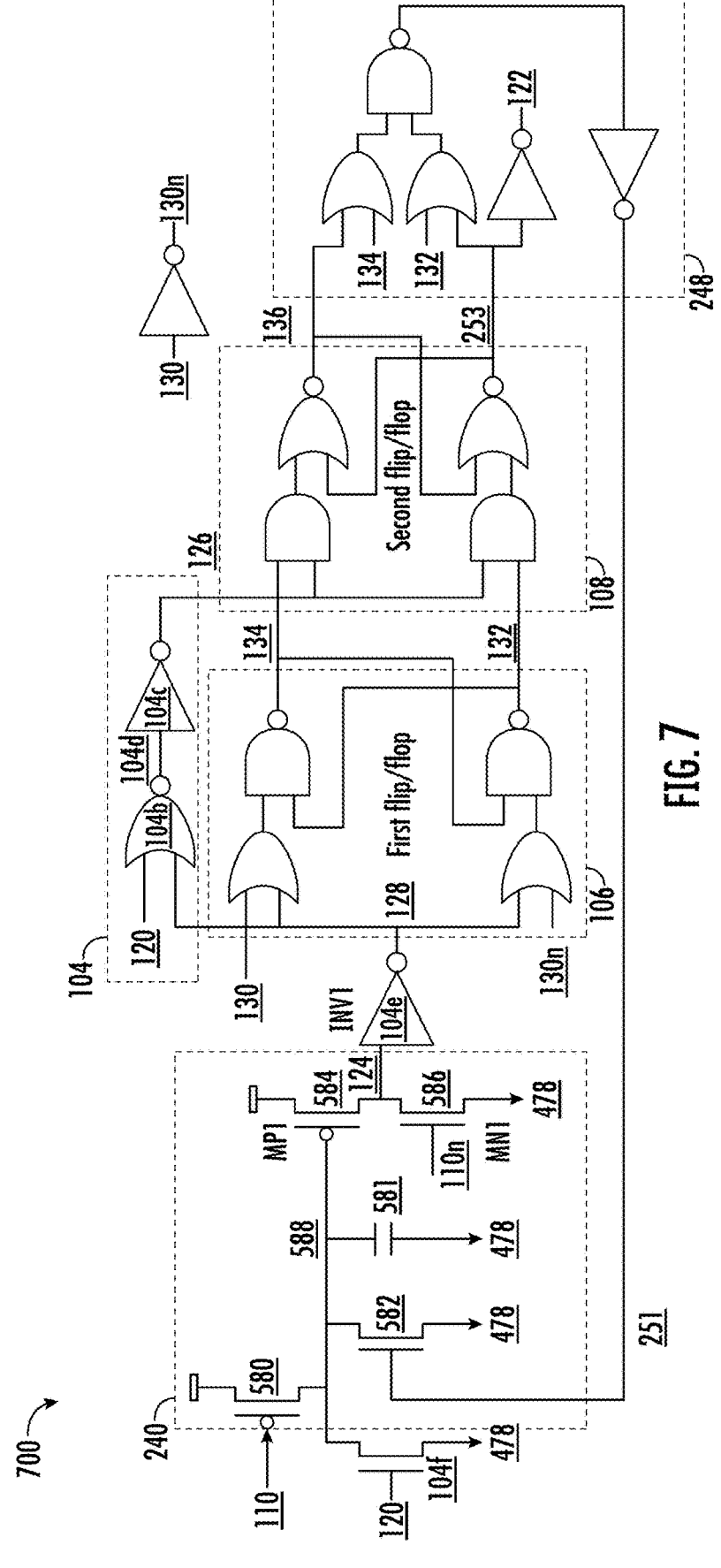
FIG. 7 depicts an example circuit schematic of an example embodiment of a pulse filter and delay circuit in accordance with an example embodiment of the present disclosure.

Referring now to FIG. 7, another embodiment of a pulse filter and delay circuit 700 is provided. Compared to the pulse filter and delay circuit 600 of FIG. 6, the pulse filter and delay circuit 700 of FIG. 7, utilizes a different mechanism to generate the first charge clocking signal 128. As depicted in FIG. 7, an inverter 104e is positioned to receive the charge signal 124 and generate the first charge clocking signal 128. In order to execute the initialization based on the reset signal 120, an additional NMOS transistor 104f is added to the net point 588 of the charge detector circuit 240. As depicted in FIG. 7, the drain terminal of the NMOS transistor 104f is electrically connected to the net point 588; the source terminal of the NMOS transistor 104f is electrically connected to the ground 478, and the gate terminal of the NMOS transistor 104f is electrically connected to the reset signal 120. The pulse filter and delay circuit 700 of FIG. 7 may utilize fewer transistor components in the implementation of the clocking circuitry 104.

Referring now to FIG. 8, another embodiment of a pulse filter and delay circuit 800 is provided. As depicted in FIG. 8, a simplified XOR logic gate 248 is provided. The simplified XOR logic gate 248 includes a first PMOS transistor 248h, a first NMOS transistor 248i, a second PMOS transistor 248j, a second NMOS transistor 248k. As depicted in FIG. 8, the gate terminal of the first PMOS transistor 248h is electrically connected to the first flip/flop out signal 132, the source terminal of the first PMOS transistor 248h is electrically connected to the second flip/flop out signal 136, and the drain terminal of the first PMOS transistor 248h is electrically connected to the drain terminal of the first NMOS transistor 248i comprising the net point 2481.

As further depicted in FIG. 8, the gate terminal of the first NMOS transistor 248i is electrically connected to the first flip/flop out signal 132, the source terminal of the first NMOS transistor 248i is electrically connected to the second flip/flop inverse signal 253, and the drain terminal of the first NMOS transistor 248i is electrically connected to the drain terminal of the first PMOS transistor 248h comprising the net point 2481.

As further depicted in FIG. 8, the gate terminal of the second PMOS transistor 248j is electrically connected to the second flip/flop out signal 136. The source terminal of the second PMOS transistor 248j is electrically connected to the first flip/flop out signal 132. The drain terminal of the second PMOS transistor 248j is electrically connected to the net point 2481.

As further depicted in FIG. 8, the gate terminal of the second NMOS transistor 248k is electrically connected to the second flip/flop inverse signal 253. The source terminal of the second NMOS transistor 248k is electrically connected to the first flip/flop out signal 132. The drain terminal of the second NMOS transistor 248k is electrically connected to the net point 2481.

As further depicted in FIG. 8, the net point 2481 is electrically connected to the input of the inverter 248g, which is configured to output the capacitor discharge signal 251. The net point 2481 represents the XOR of the first flip/flop out signal 132 and the second flip/flop out signal 136.

Referring now to FIG. 9, another embodiment of a pulse filter and delay circuit 900 is provided. As depicted in FIG. 9, the example pulse filter and delay circuit 900 combines the mechanism to generate the first charge clocking signal 128 of pulse filter and delay circuit 700 of FIG. 7, with the simplified XOR logic gate 248 of FIG. 8.

Referring now to FIG. 10, another embodiment of a pulse filter and delay circuit 1000 is provided. As depicted in FIG. 10, an alternative mechanism for generating the second charge clocking signal 126 is provided. As depicted in FIG. 10, the second stage of the clocking circuitry 104 comprises a NOR logic gate 104g. The NOR logic gate 104g is configured to receive the first charge clocking signal 128 from the NOR logic gate 104g and the reset signal 120 and generate the second charge clocking signal 126. By changing the second stage of the clocking circuitry 104 to a NOR logic gate 104g, the first stage of the second flip/flop circuit 108 is also updated. As depicted in FIG. 10, the AND logic gates (e.g., first AND logic gate 108a, second AND logic gate 108b) of the second flip/flop circuit 108 are replaced with OR logic gates. In addition, the NOR logic gates (e.g., first NOR logic gate 108e, second NOR logic gate 108f) of the second flip/flop circuit 108 are replaced with NAND logic gates. By configuring the second stage of the clocking circuitry 104 with a NOR logic gate 104g, the size of the clocking circuitry 104 may be further reduced.

Referring now to FIG. 11, another embodiment of a pulse filter and delay circuit 1100 is provided. As depicted in FIG. 11, the NMOS transistor 104f and the inverter 104e comprising the first stage of the clocking circuitry 104 of the pulse filter and delay circuit 700, 900 of FIG. 7 and FIG. 9 are utilized.

As depicted in FIG. 11, the inverter 104e is positioned to receive the charge signal 124 and generate the first charge clocking signal 128. Further, the NMOS transistor 104f is added to the net point 588 of the charge detector circuit 240. As depicted in FIG. 11, the drain terminal of the NMOS transistor 104f is electrically connected to the net point 588; the source terminal of the NMOS transistor 104f is electrically connected to the ground 478, and the gate terminal of the NMOS transistor 104f is electrically connected to the reset signal 120.

As further depicted in FIG. 11, the NOR logic gate 104g comprising the second stage of the clocking circuitry 104 is further provided. The NOR logic gate 104g is configured to receive the first charge clocking signal 128 from the inverter 104e and the reset signal 120 and generate the second charge clocking signal 126. As further depicted in FIG. 11, the AND logic gates (e.g., first AND logic gate 108a, second AND logic gate 108b) of the second flip/flop circuit 108 are replaced with OR logic gates. In addition, the NOR logic gates (e.g., first NOR logic gate 108c, second NOR logic gate 108f) of the second flip/flop circuit 108 are replaced with NAND logic gates. By configuring the first stage of the clocking circuitry 104 with an inverter 104e and the second stage of the clocking circuitry 104 with a NOR logic gate 104g, the size of the clocking circuitry 104 may be further reduced.

Figure 12:
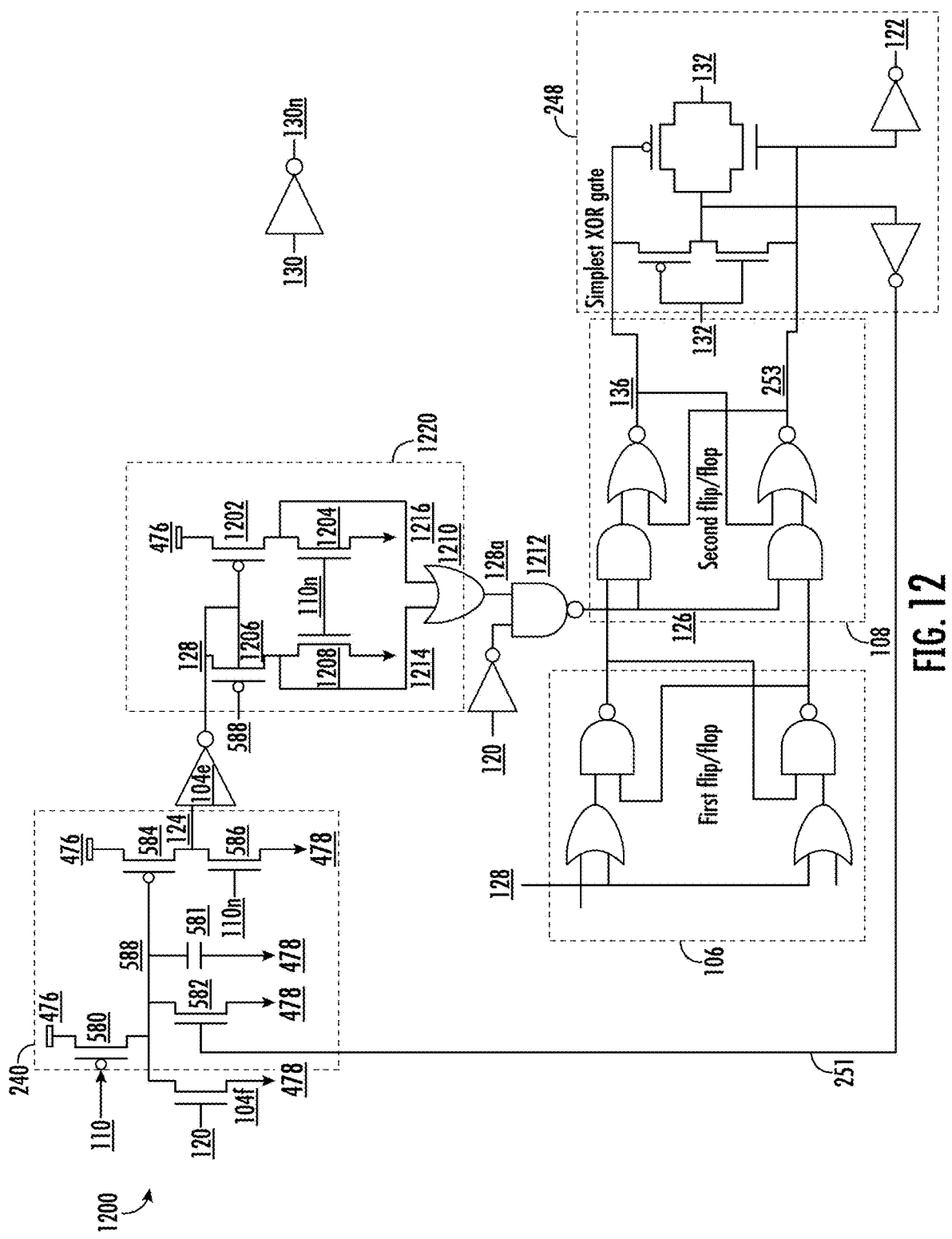
FIG. 12 depicts an example circuit schematic of an example embodiment to address degradation of transistor components of an example pulse filter and delay circuit in accordance with an example embodiment of the present disclosure.

Referring now to FIG. 12, another embodiment of a pulse filter and delay circuit 1200 comprising and additional embodiment of the clocking circuitry 104 is provided. As depicted in FIG. 12, the example pulse filter and delay circuit 1200 includes the NMOS transistor 104f and the inverter 104e comprising the first stage of the clocking circuitry 104 of the pulse filter and delay circuit 700, 900 of FIG. 7 and FIG. 9.

As depicted in FIG. 12, the inverter 104e is positioned to receive the charge signal 124 and generate the first charge clocking signal 128. Further, the NMOS transistor 104f is added to the net point 588 of the charge detector circuit 240. As depicted in FIG. 12, the drain terminal of the NMOS transistor 104f is electrically connected to the net point 588; the source terminal of the NMOS transistor 104f is electrically connected to the ground 478, and the gate terminal of the NMOS transistor 104f is electrically connected to the reset signal 120.

As further depicted in FIG. 12, a modified charge detector 1220 is provided. The modified charge detector comprises a third PMOS transistor 1206, a third NMOS transistor 1208, a fourth PMOS transistor 1202, and a fourth NMOS transistor 1204.

As depicted in FIG. 12, the source terminal of the third PMOS transistor 1206 is electrically connected to the first charge clocking signal 128; the drain terminal of the third PMOS transistor 1206 is electrically connected to a drain terminal of the third NMOS transistor 1208 at net point 1214; and the gate terminal of the third PMOS transistor 1206 is electrically connected to the net point 588 representing the charge of the charging capacitor 581. In addition, the bulk terminal of the third PMOS transistor 1206 is also electrically connected to the first charge clocking signal 128.

As further depicted in FIG. 12, the source terminal of the third NMOS transistor 1208 is electrically connected to electrical ground; the drain terminal of the third NMOS transistor 1208 is electrically connected to the drain terminal of the third PMOS transistor 1206 at net point 1214; and the gate terminal of the third NMOS transistor 1208 is electrically connected to the complementary reference voltage 110n.

As further depicted in FIG. 12, the source terminal of the fourth PMOS transistor 1202 is electrically connected to the source voltage 476; the drain terminal of the fourth PMOS transistor 1202 is electrically connected to a drain terminal of the fourth NMOS transistor 1204 at net point 1216; and the gate terminal of the fourth PMOS transistor 1202 is electrically connected to the first charge clocking signal 128.

As further depicted in FIG. 12, the source terminal of the fourth NMOS transistor 1204 is electrically connected to electrical ground; the drain terminal of the fourth NMOS transistor 1204 is electrically connected to the drain terminal of the fourth PMOS transistor 1202 at net point 1216; and the gate terminal of the fourth NMOS transistor 1204 is electrically connected to the complementary reference voltage 110n.

The modified charge detector 1220 further includes an OR logic gate 1210, configured to receive the signal at net point 1214, and the signal at net point 1216 and generate a modified first charge clocking signal 128a.

In some embodiments, the second PMOS transistor 584 of the charge detector circuit 240 may experience degradation due to violations of the threshold voltage of the second PMOS transistor 584, repeated charging and discharging of the gate voltage, and/or other changes in characteristics due to aging. Changes in characteristics of the second PMOS transistor 584 may have adverse effects on the performance of a pulse filter and delay circuit. For example, the threshold voltage of the second PMOS transistor 584 may increase in absolute value (e.g., change from −0.8V to −0.9V), causing the charge time of the second PMOS transistor 584 to reduce during operation, and thus the minimum threshold pulse width, to also reduce.

As depicted in FIG. 12, the second PMOS transistor 584 may experience aging in an instance in which the source voltage 476 and bulk voltage are high but the gate voltage of the second PMOS transistor 584 is at or near ground. Such failure mode is referred to as Negative Bias Temperature Instability (NBTI). To compensate for the aging of the second PMOS transistor 584 the modified charge detector 1220 is provided. As depicted in FIG. 12, the modified charge detector 1220 includes a third PMOS transistor 1206 and third NMOS transistor 1208 connected in series. By connecting the third PMOS transistor 1206 and third NMOS transistor 1208 in series, the third PMOS transistor 1206 and third NMOS transistor 1208 mimic the operation of the second PMOS transistor 584 and the second NMOS transistor 586. However, in an instance in which the voltage at the net point 588 is at or near 0, the source terminal of the third PMOS transistor 1206 does not receive the source voltage 476. Thus, the third PMOS transistor does not experience the damaging voltage at the source and bulk that leads to aging of the third PMOS transistor. Because of this, during operation, when the charge time of the second PMOS transistor 584 begins to reduce, the charge time of the third PMOS transistor 1206 may hold steady. By eliminating the adverse effects of aging, the pulse filter and delay circuit 1200 may continue to exhibit consistent delay times for a longer lifetime.

As further depicted in FIG. 12, a NAND logic gate 1212 is configured to generate the second charge clocking signal 126 based on a NAND operation on the modified first charge clocking signal 128a and an inverted reset signal 120. Thus, the second charge clocking signal 126 is generated with consistent timing, even in instances in which the second PMOS transistor 584 experiences changes in threshold voltage due to aging. By generating a consistent second charge clocking signal 126, the delay of the output signal 122 compared to the input signal 130 remains consistent.

Referring now to FIG. 13, a flow chart depicting an example process 1300 for generating a pulse filtered and delayed output signal (e.g., output signal 122) based on an input signal (e.g., input signal 130) is provided. At block 1302, the input signal and a reference voltage (e.g., reference voltage 110) are received at a pulse filter and delay circuit (e.g., pulse filter and delay circuit 100, 200, 600, 700, 800, 900, 1000, 1100, 1200) comprising a first flip/flop circuit (e.g., first flip/flop circuit 106), a second flip/flop circuit (e.g., second flip/flop circuit 108), and a charge detector circuit (e.g., charge detector circuit 240). As described herein, the input signal may comprise a serial data signal, or a serial clock signal of an electronic device.

At block 1304, the pulse filter and delay circuit is configured to transmit a first flip/flop out signal (e.g., first flip/flop out signal 132) and a first flip/flop inverse signal (e.g., first flip/flop inverse signal 134) at the first flip/flop circuit based on the input signal in an instance in which a first charge clocking signal (e.g., first charge clocking signal 128) is at a logic high. In some embodiments, the first buffer signal may comprise a clocked RS flip-flop, or similar device enabled by the first charge clocking signal.

In some embodiments, the pulse filter and delay circuit is configured to generate the first charge clocking signal, wherein the first charge clocking signal is equal to a charge signal (e.g., charge signal 124) in an instance in which the pulse filter and delay circuit is not in a reset state. During operation, the first stage of the clocking circuitry (e.g., clocking circuitry 104) may act as an inverter, inverting the inverted charge signal (e.g., inverted charge signal 156) to generate the first charge clocking signal provided to the first flip/flop circuit 106.

At block 1306, the pulse filter and delay circuit is configured to transmit the output signal and a second flip/flop out signal (e.g., second flip/flop out signal 136) at the second flip/flop circuit based on the first flip/flop out signal and a second charge clocking signal (e.g., second charge clocking signal 126), wherein the second charge clocking signal is an inverse of the first charge clocking signal. As described herein, the second flip/flop circuit may comprise a clocked RS flip-flop, or similar device enabled by the second charge clocking signal. The second flip/flop circuit is configured to generate the output signal, and the second flip/flop out signal, which, in combination with the first flip/flop out signal, determines the capacitor discharge signal (e.g., capacitor discharge signal 251). Because the first charge clocking signal and the second charge clocking signal are opposites during operation, the output signal is delayed.

At block 1308, the pulse filter and delay circuit is configured to charge a charging capacitor (e.g., charging capacitor 581) comprising the charge detector circuit based on a comparison of the first flip/flop out signal and the second flip/flop out signal. In some embodiments, the charging capacitor may be charged in an instance in which the first flip/flop out signal and the second flip/flop out signal are different. By detecting a difference between the first flip/flop out signal and the second flip/flop out signal, both rising and falling edges of the input signal may be detected and delayed. However, in some embodiments (e.g., FIG. 2-FIG. 3), the charging capacitor of the charge detector circuit is charged (e.g., capacitor discharge signal 251 is low) in an instance in which the first flip/flop out signal and the second flip/flop out signal are equal. Such is the case in FIG. 2-FIG. 3 because the inputs of the second flip/flop are permuted versus the outputs of the first flip/flop, which results in the outputs of the second flip/flop being inverted versus the outputs of the first flip/flop.

At block 1310, the pulse filter and delay circuit is configured to generate the charge signal in an instance in which a pulse on the input signal exceeds a minimum threshold pulse width defined by the charging capacitor and the reference current. The time required to charge the charging capacitor in order to generate the charge signal may be dependent upon the capacitance of the charging capacitor, and the reference current. Thus, the pulse filter and delay circuit filters out any pulses shorter than the minimum threshold pulse width. In addition, the pulse filter and delay circuit delays the input signal by a time equal to the minimum threshold pulse width.

Figure 14:
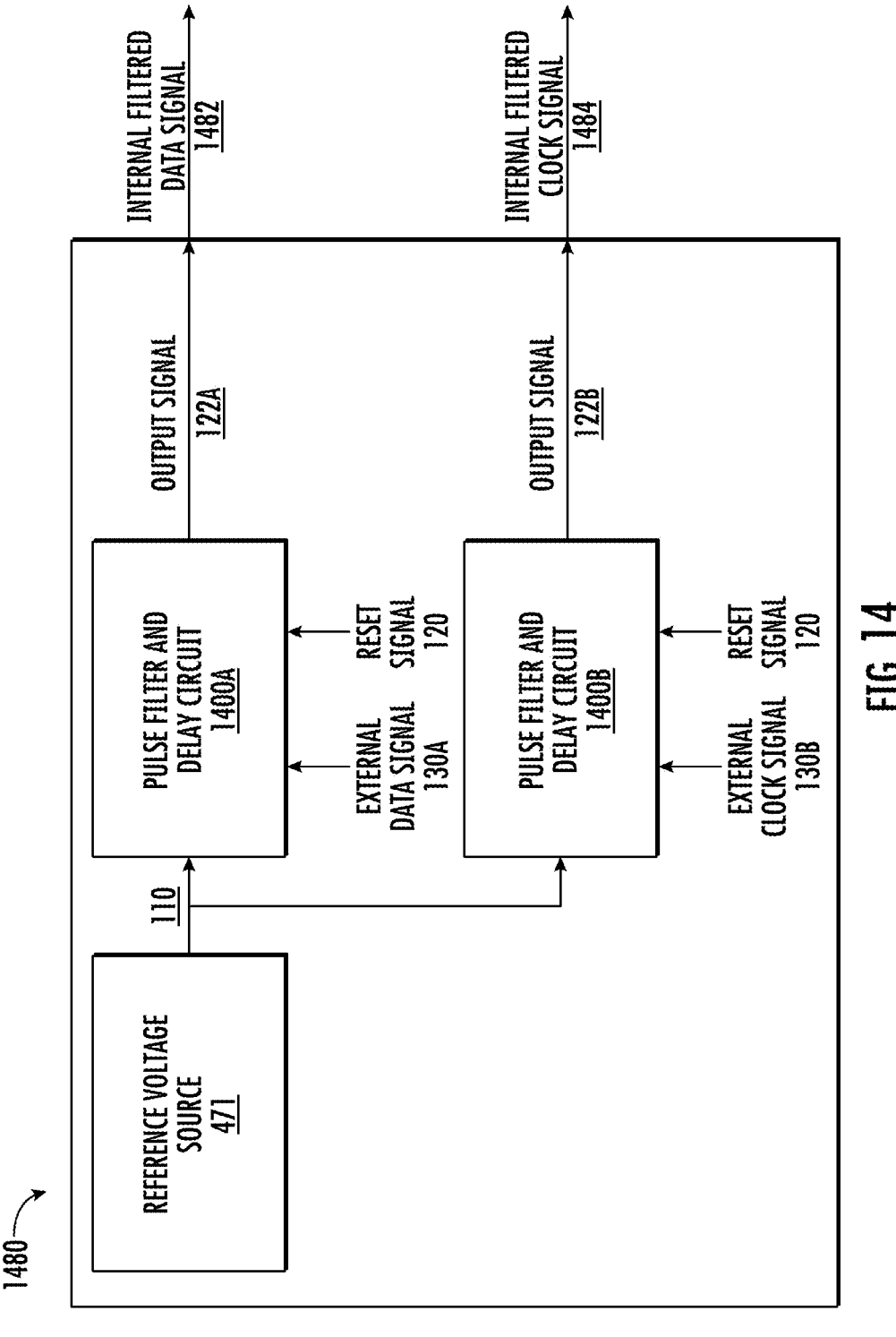
FIG. 14 depicts an example block diagram of an example electronic device configured for communication with an I2C bus in accordance with an example embodiment of the present disclosure.

Referring now to FIG. 14, an example electronic device 1480 configured to interface with an I2C bus is provided. As depicted in FIG. 14, the electronic device 1480 includes a reference voltage source 471 configured to generate a reference voltage 110. As further depicted in FIG. 14, the electronic device 1480 includes a first pulse filter and delay circuit 1400A configured to receive the reference voltage 110, an external data signal 130A, and a reset signal 120. The pulse filter and delay circuit 1400A is configured to generate an output signal 122A representing a pulse filtered and delayed version of the external data signal 130A. The reset signal 120 triggers an initialization of the pulse filter and delay circuit 1400A. As further depicted in FIG. 14, the electronic device 1480 includes a second pulse filter and delay circuit 1400B configured to receive the reference voltage 110, an external clock signal 130B, and a reset signal 120. The pulse filter and delay circuit 1400B is configured to generate an output signal 122B representing a pulse filtered and delayed version of the external clock signal 130B. The reset signal 120 triggers an initialization of the pulse filter and delay circuit 1400B.

As further depicted in FIG. 14, the electronic device 1480 is configured to generate an internal filtered data signal 1482 and an internal filtered clock signal 1484 based on received external data signal 130A and external clock signal 130b transmitted in compliance with an I2C protocol. As described herein, the I2C protocol may require precise timing of signal switches in the external data signal 130A relative to the external clock signal 130B. For example, the external data signal 130A may only transition in an instance in which the external clock signal 130B is high, and without violating setup and hold times of the external clock signal 130B. In addition, the I2C protocol may recommend that any signal pulses shorter than a minimum threshold pulse width should be filtered.

As depicted in FIG. 14, the external data signal 130A and the external clock signal 130B may represent received signals in compliance with the I2C protocol. The pulse filter and delay circuits 1400A, 1400B of the electronic device 1480 may ensure that pulse widths shorter than the minimum threshold pulse width on the external data signal 130A and the external clock signal 130B are filtered.

In some embodiments, the pulse filter and delay circuit 1400A and the pulse filter and delay circuit 1400B are designed to provide the same filtering time constant, so that the resulting delays from external data signal 130A and internal filtered data signal 1482 on the one hand, and the delays between external clock signal 130B and internal filtered clock signal 1484 on the other hand are similar. Thus, ensuring proper relative timings of the internal filtered data signal 1482 and the internal filtered clock signal 1484 compared to the external data signal 130A and the external clock signal 130B. While this detailed description has set forth some embodiments of the present invention, the appended claims cover other embodiments of the present invention which differ from the described embodiments according to various modifications and improvements. For example, one skilled in the art may recognize that such principles may be applied to any electronic device that requires precise signal delays, and/or pulse filtering. For example, a ring oscillator may utilize a series of pulse filter and delay circuits to generate an oscillating signal with precise timing.

Within the appended claims, unless the specific term "means for" or "step for" is used within a given claim, it is not intended that the claim be interpreted under 35 U.S.C. 112, paragraph 6.

Use of broader terms such as "comprises," "includes," and "having" should be understood to provide support for narrower terms such as "consisting of," "consisting essentially of," and "comprised substantially of" Use of the terms "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

The invention claimed is:

1. A circuit comprising:
a first flip/flop circuit configured to generate a first flip/flop out signal and a first flip/flop inverse signal based on an input signal and a first charge clocking signal;
a second flip/flop circuit configured to generate an output signal and a second flip/flop out signal based on the first flip/flop out signal, the first flip/flop inverse signal, and a second charge clocking signal, wherein the second charge clocking signal comprises an inverse of the first charge clocking signal; and
a charge detector circuit comprising at least a charging capacitor and configured to generate a charge signal based on a change in the input signal,
  wherein the first charge clocking signal is generated based on the charge signal, and
  wherein the charge detector circuit is configured to filter pulses based on a capacitance value of the charging capacitor and a reference voltage.

2. The circuit of claim 1, wherein the output signal is delayed relative to the input signal by an output delay based on the charging capacitor and the reference voltage.

3. The circuit of claim 1, further comprising clocking circuitry comprising:
a first input configured to receive the charge signal;
a first output configured to generate the first charge clocking signal based on the charge signal and a system reset signal; and
a second output configured to generate the second charge clocking signal based on the first charge clocking signal and the system reset signal.

4. The circuit of claim 3, wherein the first charge clocking signal is generated by performing a NAND logic operation on the charge signal and the system reset signal, and wherein the second charge clocking signal is generated by performing a NAND logic operation on the first charge clocking signal and the system reset signal.

5. The circuit of claim 3, wherein the first flip/flop circuit comprises:
a first RS flip-flop comprising:
  a first input configured to receive the input signal;
  a second input configured to receive an inverse input signal;
  a third input configured to receive the first charge clocking signal;
  a first output configured to generate the first flip/flop inverse signal; and
  a second output configured to generate the first flip/flop out signal.

6. The circuit of claim 5, wherein the second flip/flop circuit comprises:
a second RS flip-flop comprising:
  a first input configured to receive the first flip/flop inverse signal;
  a second input configured to receive the first flip/flop out signal;
  a third input configured to receive the second charge clocking signal;
  a first output configured to generate a second flip/flop inverse signal; and
  a second output configured to generate the second flip/flop out signal.

7. The circuit of claim 6, wherein the output signal comprises the second flip/flop inverse signal.

8. The circuit of claim 6, wherein the charge detector circuit comprises:
a first input configured to receive the first flip/flop out signal;
a second input configured to receive the second flip/flop out signal;
a third input configured to receive the reference voltage; and
a first output configured to generate the charge signal.

9. The circuit of claim 8, wherein the charge detector circuit is configured to charge the charging capacitor based on an XOR operation of the first flip/flop out signal and the second flip/flop out signal.

10. The circuit of claim 3, wherein, during an initialization state, in which the system reset signal is asserted, the first flip/flop out signal and the second flip/flop out signal are forced to a logic equivalent.

11. A method for generating a pulse filtered and delayed output signal based on an input signal, the method comprising:
receiving the input signal and a reference voltage at a pulse filter and delay circuit comprising a first flip/flop circuit, a second flip/flop circuit, and a charge detector circuit;
transmitting a first flip/flop out signal and a first flip/flop inverse signal at the first flip/flop circuit based on the input signal and on a first charge clocking signal;
transmitting the output signal and a second flip/flop out signal at the second flip/flop circuit based on the first flip/flop out signal and a second charge clocking signal, wherein the second charge clocking signal is an inverse of the first charge clocking signal;
charging a charging capacitor comprising the charge detector circuit based on a comparison of the first flip/flop out signal and the second flip/flop out signal; and
generating a charge signal in an instance in which a pulse on the input signal exceeds a minimum threshold pulse width defined by the charging capacitor and the reference voltage.

12. An electronic device configured to transmit signals on an inter-integrated communication (I2C) bus, the electronic device comprising:
a serial data terminal configured to receive a serial data signal on a serial data line of the I2C bus;
a serial clock terminal configured to receive a serial clock signal on a serial clock line of the I2C bus; and
a pulse filter and delay circuit, comprising:
  a first flip/flop circuit configured to transmit a first flip/flop out signal and a first flip/flop inverse signal based on an input signal and a first charge clocking signal;
  a second flip/flop circuit configured to transmit an output signal and a second flip/flop out signal based on the first flip/flop out signal, the first flip/flop inverse signal, and a second charge clocking signal, wherein the second charge clocking signal comprises an inverse of the first charge clocking signal; and
  a charge detector circuit comprising at least a charging capacitor and configured to generate a charge signal based on a change in the input signal,
wherein the first charge clocking signal is generated based on the charge signal;
  wherein the input signal is coupled to the serial data terminal, and wherein the pulse filter and delay circuit is configured to filter pulses based on a capacitance value of the charging capacitor and a reference voltage.

13. The electronic device of claim 12, wherein the output signal is delayed relative to the input signal by an output delay based on the charging capacitor and the reference voltage.

14. The electronic device of claim 12, further comprising clocking circuitry comprising:

a first input configured to receive the charge signal;

a first output configured to generate the first charge clocking signal based on the charge signal and a system reset signal; and a second output configured to generate the second charge clocking signal based on the first charge clocking signal and the system reset signal.

15. The electronic device of claim 14, wherein the first charge clocking signal is generated by performing a NAND logic operation on the charge signal and the system reset signal, and wherein the second charge clocking signal is generated by performing a NAND logic operation on the first charge clocking signal and the system reset signal.

16. The electronic device of claim 14, wherein the first flip/flop circuit comprises:

a first RS flip-flop comprising:

a first input configured to receive the input signal;

a second input configured to receive an inverse input signal;

a third input configured to receive the first charge clocking signal;

a first output configured to generate the first flip/flop inverse signal; and a second output configured to generate the first flip/flop out signal.

17. The electronic device of claim 16, wherein the second flip/flop circuit comprises:

a second RS flip-flop comprising:

a first input configured to receive the first flip/flop inverse signal;

a second input configured to receive the first flip/flop out signal;

a third input configured to receive the second charge clocking signal;

a first output configured to generate a second flip/flop inverse signal; and a second output configured to generate the second flip/flop out signal.

18. The electronic device of claim 17, wherein the output signal comprises a logic NOT of the second flip/flop inverse signal.

19. The electronic device of claim 17, wherein the charge detector circuit comprises:

a first input configured to receive the first flip/flop out signal;

a second input configured to receive the second flip/flop out signal;

a third input configured to receive the reference voltage; and a first output configured to generate the charge signal.

20. The electronic device of claim 19, wherein the charge detector circuit is configured to charge the charging capacitor based on an XOR operation of the first flip/flop out signal and the second flip/flop out signal.

* * * * *